(12) United States Patent
Huber et al.

(10) Patent No.: US 9,246,312 B2
(45) Date of Patent: Jan. 26, 2016

(54) DYNAMICAL FABRY-PEROT TUNEABLE FILTER DEVICE

(71) Applicant: Ludwig-Maximilians-Universität München, München (DE)

(72) Inventors: Robert Huber, Schnaitsee (DE); Wolfgang Wieser, München (DE); Thomas Klein, Munich (DE); Christoph Eigenwillig, Neuried (DE); Benjamin Biedermann, Germering (DE); Dieter Muellner, Brannenburg (DE); Michael Eder, Traunstein (DE)

(73) Assignee: Ludwig-Maximilians-Universität München, München (DE)

( * ) Notice: Subject to any disclaimer, the term of this patent is extended or adjusted under 35 U.S.C. 154(b) by 0 days.

(21) Appl. No.: 14/476,838

(22) Filed: Sep. 4, 2014

(65) Prior Publication Data
US 2014/0369374 A1 Dec. 18, 2014

Related U.S. Application Data

(63) Continuation of application No. 13/572,824, filed on Aug. 13, 2012, now Pat. No. 8,855,149.

(30) Foreign Application Priority Data

Aug. 11, 2011 (DE) .......................... 10 2011 109 971

(51) Int. Cl.
*H01S 5/42* (2006.01)
*G01J 3/26* (2006.01)
(Continued)

(52) U.S. Cl.
CPC . *H01S 5/423* (2013.01); *G01J 3/26* (2013.01); *G02B 6/29358* (2013.01);
(Continued)

(58) Field of Classification Search
CPC ......... H01S 5/183; H01S 5/423; H01S 5/141; H01S 5/02284; H01S 3/105
See application file for complete search history.

(56) References Cited

U.S. PATENT DOCUMENTS 6,645,784 B2 * 11/2003 Tayebati et al. .................. 438/46
7,415,049 B2 8/2008 Flanders et al. ................ 372/20
(Continued)

FOREIGN PATENT DOCUMENTS

EP 2113804 A1 11/2009 ............. G02B 26/00
WO WO 99/12235 3/1999 ................ H01S 3/30

OTHER PUBLICATIONS

Bousseksou, A., et al., "Wavelength tunable InP-based EP-VECSEL operating at room temperature and in CW at 1.55 gm." Electronics Letters' 40.23 (2004): 1490-1491.*

(Continued)

*Primary Examiner* — Armando Rodriguez
(74) *Attorney, Agent, or Firm* — Sunstein Kann Murphy & Timbers LLP

(57) ABSTRACT

A Fabry-Pérot tuneable filter device is described with reflecting elements separated by an optical path length to form an optical resonator cavity. A first actuator means is directly or indirectly coupled with a first reflecting element. And the first actuator means is configured to modulate the optical path length between first and second reflecting elements by a modulation amplitude to thereby sweep the optical resonator cavity through a band of optical resonance frequencies with a sweep frequency of 70 kHz or more. And the mechanical coupling between selected elements of the arrangement is sufficiently low such that when operated at the sweep frequency, the selected elements act as a system of coupled oscillating elements. In addition or alternatively, the first actuator means is directly or indirectly coupled with the first reflecting element so as to substantially drive the first reflecting element only.

17 Claims, 20 Drawing Sheets

(51) Int. Cl.
| | |
|---|---|
| *G02B 6/293* | (2006.01) |
| *H01S 5/14* | (2006.01) |
| *H01S 3/105* | (2006.01) |
| *H01S 5/183* | (2006.01) |
| *G02B 26/00* | (2006.01) |
| *H01S 5/022* | (2006.01) |

(52) U.S. Cl.
CPC .............. *G02B 26/001* (2013.01); *H01S 3/105* (2013.01); *H01S 5/141* (2013.01); *H01S 5/183* (2013.01); *H01S 5/02284* (2013.01)

(56) References Cited

U.S. PATENT DOCUMENTS

| | | | | |
|---|---|---|---|---|
| 2003/0002545 | A1* | 1/2003 | Jiang | H01S 5/041 372/20 |
| 2003/0161358 | A1 | 8/2003 | Mueller | 372/10 |
| 2008/0187013 | A1* | 8/2008 | Guenter | H04B 10/802 372/29.01 |

OTHER PUBLICATIONS

Bush, Jeff, "Swept Laser Interferometric Interrogation", *Proceedings of SPIE*, vol. 7316, 2009, pp. 73160S-1-73160S-7, XP040496546, Bellingham WA 98227-0010 USA.

Kuznetsov, et al, "Compact Ultrafast Reflective Fabry-Perot Tunable Lasers for OCT Imaging Applications", *Proceedings of SPIE*, vol. 7554, Jan. 2, 2012, pp. 75541F-75541F-6, XP055022317, ISSN: 0277-786X, DOI:11.1117/12.842567.

Yeh, et al, "A High-Speed Tunable Filter Using a Concave Fiber Mirror", *2005 Optical Fiber Communications Conference Technical Digest*, IEEE Cat. No. 05CH37672) IEEE Piscataway, NJ, USA, IEEE, vol. 3, Mar. 6, 2005, pp. 423-425, XP010832764, ISBN: 978-1-55752-783-7.

European Patent Office, European Search Report and Written Opinion, Application No. EP12180271.4-2217, date of mailing Dec. 10, 2012, 11 pages.

AXSUN Technologies, Press Release, Dec. 7, 2009, 2 pages.

Biedermann, Benjamin, *Dissertation*, dated Sep. 13, 2010, 99 pages.

Biedermann, Benjamin, Translation—Excerpt of Biedermann *Dissertation* of Sep. 13, 2010, 2 pages.

Briles, et al, "Simple piezoelectric-actuated mirror with 180 kHz servo bandwidth", *Optics Express*, May 10, 2010, vol. 18, No. 10, pp. 9739-9746, 8 pages.

Eigenwillig, et al, "Subharmonic Fourier domain mode locking", *Optics Letters*, Mar. 15, 2009, vol. 34, No. 6, pp. 725-727, 3 pages.

Eigenwillig, et al, "Wavelength swept amplified spontaneous emission source", *Optics Express*, Oct. 12, 2009, vol. 17, No. 21, pp. 18794-18807, 14 pages.

Huber, et al, "Amplified, frequency swept lasers for frequency domain reflectometry and OCT imaging: design and scaling principles", *Optics Express*, May 2, 2005, vol. 13, No. 9, pp. 3513-3528, 16 pages.

Huber, et al "Three-dimensional and C-mode OCT imaging with a compact, frequency swept laser source at 1300 nm", *Optics Express*, Dec. 26, 2005, vol. 13, No. 26, pp. 10523-10538, 16 pages.

Huber, et al, "Fourier Domain Mode Locking (FDML): A new laser operating regime and applications for optical coherence tomography", *Optics Express*, Apr. 17, 2006, vol. 14, No. 8, pp. 3225-3237, 13 pages.

Huber, et al, "Buffered Fourier domain mode locking: unidirectional swept laser sources for optical coherence tomography imaging at 370,000 lines/s", *Optics Letters*, Oct. 15, 2006, vol. 31, No. 20, pp. 2975-2977, 3 pages.

Jayaraman, et al, "OCT Imaging up to 760 kHz Axial Scan Rate Using Single-Mode 1310nm MEMS-Tunable VCSELs with >100nm Tuning Range", *OSA/CLEO* 2011, 2 pages.

Klein, et al "Megahertz OCT for ultrawide-field retinal imaging with a 1050nm fourier doman mode-locked laser", *Optics Express*, Feb. 14, 2011, vol. 19, No. 4, pp. 3044-3062, 19 pages.

Oh, et al, "115 kHz tuning repetition rate ultrahigh-speed wavelength-swept semiconductor laser", *Optics Letters*, Dec. 1, 2005, vol. 30, No. 23, pp. 3159-3161, 3 pages.

Oh, et al, ">400 kHz repetition rate wavelength-swept laser and application to high-speed optical frequency domain imaging", Sep. 1, 2010, vol. 35, No. 17, pp. 2919-2921, 3 pages.

Wieser, et al, "Multi-Megahertz OCT: High quality 3D imaging at 20 million A-scans and 4.5 GV oxels per second", *Optics Express*, Jul. 5, 2010, vol. 18, No. 14, pp. 14685-14704, 20 pages.

Yun, et al, "High-speed wavelength-swept semiconductor laser with a polygon-scanner-based wavelength filter", *Optics Letters*, Oct. 15, 2003, vol. 28, No. 20, pp. 1981-1983, 3 pages.

Vakhshoori, D., et al., "2 mW CW singlemode operation of a tunable 1550 nm vertical cavity surface emitting laser with 50 nm tuning range." *Electronics Letters* 35.11 (1999): 900-901.

Boussekseou, A., et al., "Wavelength tunable InP-based EP-VECSEL operating at room temperature and in CW at 1.55 μm." *Electronics Letters* 40.23 (2004): 1490-1491.

European Patent Office, Extended European Search Report, Application No. EP14187953.6, date of mailing Mar. 10, 2015, 9 pages.

\* cited by examiner

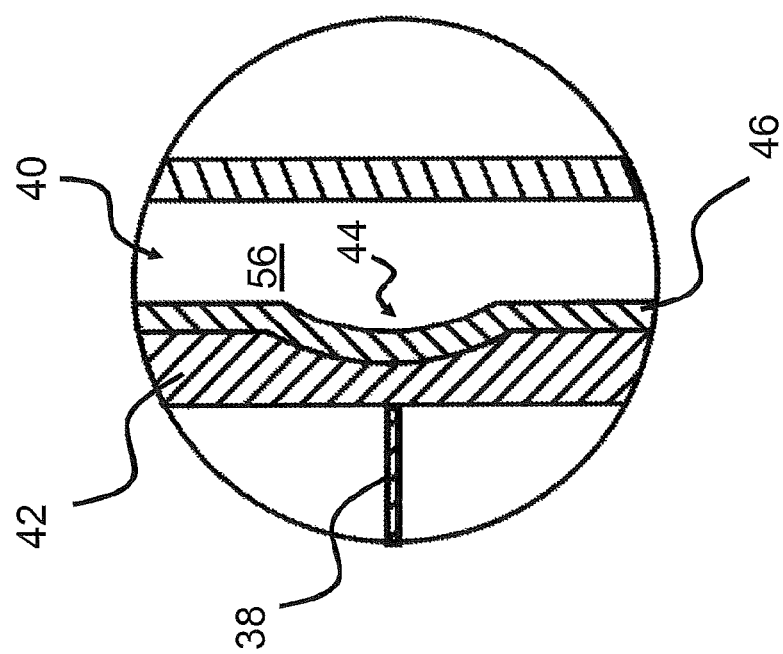

DYNAMICAL FABRY-PEROT TUNEABLE FILTER DEVICE

This application claims priority from U.S. patent application Ser. No. 13/572,824, filed Aug. 13, 2012, which in turn claims priority from German Patent Application 10 2011 109 971.2, filed Aug. 11, 2011, both of which are incorporated herein by reference in their entireties.

FIELD OF THE INVENTION

The present invention is in the field of optics. In particular, the present invention relates to a tuneable VCSEL device. Such tuneable VCSEL devices are particularly useful for optical coherence tomography (OCT) applications.

BACKGROUND OF THE INVENTION

Optical coherence tomography (OCT) is an optical signal acquisition and processing method. It captures micrometer resolution 3D-images within optically scattering media, such as bio-logical tissue. A distance from a scattering medium is measured by use of interferometric signals. In OCT, comparatively long wavelength light, typically in the near-infrared region is used. This has the advantage that the light may penetrate rather deeply into the scattering medium, allowing to obtain sub-surface images at near-microscopic resolution. OCT has proven particularly useful in the imaging of the human eye, allowing obtaining high resolution images of the retina and the anterior segment of the eye. A further very attractive application of OCT currently under development is intravascular imaging in cardiology.

As in any interferometric methods, it is possible to measure the interference signal in the time domain or in the frequency domain. Simply put, in the time domain the length of the interferometer reference arm is varied and the intensity of the interference signal is measured, without paying attention to the signal spectrum. Alternatively, the interference of the individual spectral components can be measured, which corresponds to the measurement in the frequency domain. There are also mixed variants of time and frequency domain OCT, of which the "time encoded frequency domain OCT", which is also referred to as the "swept source OCT" has recently received particular attention. In the swept source OCT, each frequency scan allows to obtain exactly one depth scan of the OCT image. There is a common understanding that the swept source OCT is the most powerful and promising OCT variant that will be of increasing importance, in particular for ophthalmologic and cardiologic OCT imaging. Currently, there are three promising approaches to obtain tuneable laser sources allowing for higher sweep rates:

(i) The Fourier domain mode locking (FDML) techniques as described in Huber, R., M. Wojtkowski, and J. G. Fujimoto, *"Fourier Domain Mode Locking (FDML): A new laser operating regime and applications for optical coherence tomography"*. Optics Express, 2006. 14(8): p. 3225-3237. An FDML laser typically comprises a semiconductor optical amplifier as a light source, a fiber Fabry-Perot filter acting as an optical band pass filter and a delay line that is adapted such that the light circulation time is an integer multiple of the filter sweep frequency. A portion of the circulating laser light is then extracted by a fiber coupler. The idea underlying the FDML technique is that light passing through the filter takes just as long to propagate through the laser cavity and arrive back at the filter as the filter takes for sweeping the frequency once (or an integer multiple times). This way, wave trains with different wavelengths can pass through the gain medium of the laser several times and are thereby amplified, since any part of the wave train from the previous roundtrip acts as a seed for stimulated emission of the gain medium with the resonator tuned to the current wavelength.

(ii) A wavelength swept amplified spontaneous emission source as described in Eigenwillig, C. M., et al., *Wavelength swept amplified spontaneous emission source.* Optics Express, 2009. 17(21): p. 18794-18807. In a wavelength swept amplified spontaneous emission source, amplified spontaneous emission light alternately passes a cascade of optical gain elements and tuneable band pass filters.

(iii) Tuneable vertical-cavity surface emitting lasers (VCSELs). A dynamically tuneable VCSEL has recently been proposed in Jayaraman, V., et al. *"OCT Imaging up to 760 kHz Axial Scan Rate Using Single-Mode 1310 nm MEMS-Tuneable VCSELs with >100 nm Tuning Range"* in CLEO. 2011. The VCSEL of Jayaraman et al. comprises a fully oxidized AlGaAs mirror to which an InP-based multi-quantum well is wafer bonded, the multi-quantum well representing an active medium. A dielectric mirror is provided opposite the multi-quantum well, with an air gap inbetween. Accordingly, the dielectric mirror and the fully oxidized AlGaAs mirror form a resonator cavity and hence effective-ly a Fabry-Perot filter. The top dielectric mirror is flexibly suspended by rather delicate material bridges and can be moved up and down by electrostatic actuation, thereby forming a Fabry-Perot tuneable filter device. Note in this regard that in the present disclosure, the term "Fabry-Perot filter device" shall be given the broadest possible meaning and shall in particular not be limited to passive filters. The tuneable VCSEL is a micro-electro-mechanical system (MEMS) device based on semiconductor fabrication techniques, i.e. deposition of material layers, patterning by photolithography and etching to produce the required shapes.

Accordingly, each of the three abovementioned light sources with a potential for higher frequency sweep rates than conventional tuneable lasers employs some sort of Fabry-Perot filter device, and the sweep frequency of the Fabry-Perot filter device turns out to be the limiting factor of the sweep frequency of the light source as a whole.

FIG. 1 is a schematic view of a fiber Fabry-Pérot tuneable filter (FFP-TF) 10 as known from prior art, see for example U.S. Pat. No. 6,904,206 B2 or U.S. Pat. No. 5,208,886. The FFP-TF 10 comprises two mirrors 12 deposited directly to the ends of optical fibers 14 which are accommodated in ferrules 16 held in holding pieces 18 which are in turn connected via a piezo-electric actuator 20.

Between the two mirrors 12, an air gap is formed that defines an optical resonator cavity. By operation of the piezo-actuator 20, the optical path length between the two mirrors 12, or in other words, the length of the resonator cavity formed between the two mirrors 12 can be tuned. When the optical length of the round trip length of the cavity is an integer of a wavelength, then this wavelength together with a narrow band resonates inside the cavity and passes through the filter 10 with very low loss. Wavelengths not meeting this resonance condition, however, will not pass from one optical fiber 14 to the other, but will be blocked by the filter instead. This way, the FFP-TF 10 acts as tuneable narrow band pass filter.

The FFP-TF 10 design of FIG. 1 has proven to be very robust and reliable in operation. However, it turns out that the tuning rate, i.e. the sweep frequency of the FFP-TF 10 is limited. For example, a FFP-TF of a design as shown in FIG. 1 that is commercially available from Micron Optics, Inc. allows for a tuning frequency of up to 50 kHz only.

A further FFP-TF is commercially available from LambdaQuest, see Lambda Quest, L. "*High Speed Optical Tuneable Filter* 2011"; Available from: www.lambdaquest.com/products.htm. The LambdaQuest FFP-TF has a U-shaped design, where the two arms of the U carry the ferrules with the fibers and where the arms are connected by a piezo-actuator. The general shape is shown in FIG. 2 in a simplified way, where the ferrules, the mirrors and the fibers have been omitted. Instead, FIG. 2 only shows the two arms 22 that in the actual device would carry the ferrules and the fibers, which are connected by a piezo-actuator 24.

At low operation frequencies of the piezo-actuator 24, i.e. at low sweep frequencies, the arms 22 will simply be moved to and fro according to the expansion and contraction of the piezo-actuator 24. At higher frequencies, the entire U-shaped structure will start to oscillate in a vibration mode that is indicated by the arrows 26 in FIG. 2, where the arrows 26 resemble the (heavily exaggerated) local oscillation amplitude.

The vibration mode of the U-shaped structure can also be seen in the response function of the LambdaQuest filter recorded by the inventors which is shown in FIG. 3. The response function characterizes the modulation amplitude of the resonator cavity as a function of driving frequency of the piezo-actuator 24. As is seen in FIG. 3, this response function increases from some low frequency value, also referred to "DC value" herein, to some peak a little over 50 kHz, where the modulation amplitude of the air gap is the largest. Beyond this peak, the response function drops below the DC value. In practice, this means that beyond the resonance peak, the amplitude of the air gap modulation will be generally too small to allow for the suitable tuneable frequency range. In fact, the highest sweep frequency of the LambdaQuest filter according to the manufacturer is 40 kHz.

Both FFP-TFs of FIGS. 1 and 2 are ordinary "mechanical" devices, where mechanical components like the holding pieces 18 and the ferrules 16 of FIG. 1 or the arms 22 of FIG. 2 are mechanically moved by a piezo-actuator 20, 24, respectively. It is currently found difficult to push the sweep frequency limit significantly higher than the 40 or 50 kHz of the fastest currently commercially available FFP-TFs when employing an ordinary mechanical design as shown in FIGS. 1 and 2. Instead, for higher scanning frequencies, MEMS devices are often believed to be more promising. A good example is the MEMS-based VCSEL of Jayaraman et al. discussed above, where the suspended top dielectric mirror can be moved at a frequency of as high as 380 kHz.

However, VCSELS based on MEMS technology also have considerable drawbacks in practice. The manufacturing requires a large number of etching steps that need to be carried out in a clean room. Also, since the material bridges suspending the mirror are very thin and hence difficult to manufacture, there is an inherent reproducibility problem. Also, since the top mirror is very thin, heat dissipation is rather difficult. Further, since the top mirror is actuated electrostatically, the necessary control voltages are rather high and the elongation depends highly non-linearly on the control voltage. And while in general the extremely small mass of the top mirror is an advantage when it comes to sweep frequency, the resonance wavelength tends to be unstable due to thermal noise (Brownian motion), see J. Dellunde, et al., "*Transverse-mode selection and noise properties of external-cavity vertical-cavity surface-emitting lasers including multiple-reflection effects*", *Journal of the Optical Society of America B-Optical Physics*, vol. 16, pp. 2131-2139, November 1999.

SUMMARY OF THE INVENTION

According to a the invention, a tuneable VCSEL is provided, comprising:
 a first and a second reflecting element separated by an optical path length to form an optical resonator cavity,
 a first actuator means mechanically coupled with one or both of said first and second reflecting elements, said first actuator means being configured to modulate the optical path length between said first and second reflecting elements by a modulation amplitude, and
 a waveguide, in particular an optical fiber, coupled with one of the reflecting elements for coupling light out of the resonator cavity, wherein the surface of at least one of the first and second reflecting elements has a concave recess formed therein.

Note that typically, VCSELs are MEMS devices, with the advantages but also the drawbacks referred to in the introductory portion. These drawbacks are particularly related to the rather complicated manufacturing, to the difficulties with regard to reproducibility and reliability, as well as to difficulties with the operating stability due to noise (Brownian motion) which affects the rather delicate moving mirrors of tuneable VCSELs based on MEMS.

According to the invention, a very robust tuneable VCSEL is provided that can be manufactured with much less demand for manufacturing equipment and that exhibits a good reliability and reproducibility.

Preferably, the resonator cavity between the two reflecting elements is free of any light guiding medium. This is different from tuneable fiber Fabry-Perot VCSELs as for example disclosed in U.S. Pat. No. 6,263,002, where the light is confined in a waveguide within the cavity. Dispensing with any light guiding medium in the resonator cavity allows for longer resonator length modulation amplitudes and higher sweep frequencies. At the same time, the total length of the resonator cavity without light guiding medium can generally be made shorter, hence allowing for a larger free spectral range (FSR).

According to the invention, light guiding materials in the resonator cavity can be dispensed with by providing a concave recess formed in one of the reflecting elements. The concave recess can be designed such as to provide a stable resonator for the wavelengths of interest. Simply put, a "stable resonator" is a resonator where the light will not escape even after plural reflections. For more details about stable resonators, reference is made to the textbook, "Lasers" of A. E. Siegman, University Science Books, 55D Gate Five Road, Sausalito, Calif. 94965, ISBN 0-935702-11-3.

In a preferred embodiment, the waveguide is in direct contact with one of the reflecting elements. Herein, the expression "direct contact" shall mean that no additional optical elements are provided between the waveguide and the reflecting element.

In a preferred embodiment, one of the reflecting elements comprises a polymer layer in which the concave recess is formed and that is coated with a reflecting layer, in particular a dielectric reflecting layer. Herein, the thickness of the polymer layer is preferably larger than 5 µm, more preferably larger than 8 µm and/or preferably smaller than 100 µm, more preferably smaller than 40 µm.

This embodiment has great advantages from a manufacturing point of view. The concave recess can be easily formed in the polymer layer such as by a mechanical indentation or by laser ablation. Further, the concave recess can be formed after the polymer layer has been applied to the end of the fiber and also the end face of a ferrule surrounding the fiber. Then, the concave recess can be integrally formed precisely at the desired location, avoiding any alignment of separate components that would make the manufacture more complicated and prone to errors. Direct laser machining of the concave structure would have the same advantages.

The first actuator preferably comprises at least one piezo-electric actuator, in particular, a lead-zirconate-titanate (PZT) actuator.

Preferably, the waveguide, typically an optical fiber, is accommodated in a ferrule. The ferrule can be made from glass, metal or zirconia and can be a standard telecommunications component that is manufactured with high precision but is available at fairly low prices.

In a preferred embodiment, one of the reflecting elements comprises a substrate, the substrate being provided with a reflecting layer. The substrate may be disposed on the end of a fiber ferrule, although no light is coupled out of the cavity through the substrate and the ferrule hence does not contain any fiber. However, using a fiber ferrule for mounting the substrate allows for a very precise positioning thereof employing inexpensive, "off-the-shelf" components. What is more, this allows mounting both reflecting elements—i.e. the reflecting element that is coupled to a fiber and the reflecting element that is not coupled to a fiber—in the same manner, preferably even using identical holding frames which permits a symmetric design and decreases manufacturing costs. For this purpose, the two ferrules preferably have at least the same outside diameter.

In a preferred embodiment, a gain medium is provided on top of one of the reflecting elements. The gain medium may be provided with an anti-reflective coating. Preferably, the thickness of the gain medium is a multiple of ¼ of the operating wavelength of the VCSEL.

In a preferred embodiment, one of the reflecting elements is formed by a plate, said plate having a free portion that is free to carry out plate vibrations and a supporting portion where the plate is supported. Herein, the plate may, but need not, carry the gain medium.

The free portion is preferably a central portion and the supporting portion is a circumferential portion at least partly surrounding the central portion of the plate, wherein the supporting portion is directly or indirectly supported by the first actuator means. Preferably, the first actuator means is ring-shaped or is comprised of a plurality of actuators arranged along the circumferential portion of said plate. Such plate may resonate with high amplitude at very high frequencies, thereby modulating the resonator cavity length with a high frequency and in effect allowing for a high sweep frequency.

In a preferred embodiment, the VCSEL comprises a second actuator means, in particular a second piezo-electric actuator. The second piezo-electric actuator may be devised for low frequency actuation such as to compensate drifts in the cavity length and the like, while the first actuator means allows for the frequency sweeps in operation.

In one embodiment, the radius of the resonator cavity is larger than 40 µm, preferably larger than 80 µm and most preferably larger than 150 µm. In addition or alternatively, the radius of the resonator cavity may be smaller than 5 mm, preferably smaller than 1 mm and most preferably smaller than 800 µm.

In a preferred embodiment, the free spectral range of the VCSEL is larger than 1 nm, preferably larger than 30 nm and most preferably larger than 80 nm.

The center wavelength of the tuneable VCSEL is preferably chosen among one of the following ranges: 750-870 nm, 1000-1100 nm, 1250-1350 nm and 1480-1600 nm. In a preferred embodiment, the VCSEL is operated in one of the $5^{th}$ to $15^{th}$ order.

As mentioned before, the tuneable VCSEL of the invention is of high practical value even if its sweep frequency is not particularly high. However, preferably the sweep frequency of the frequency tuning is at least 1 kHz, more preferably at least 50 kHz. Much higher frequencies can, nevertheless, be obtained by using one or more of the features described below.

Preferably, the tuneable VCSEL is pumped using a pump diode having a wavelength between 950 and 1010 nm. In a preferred embodiment, the optical fiber is a polarization conserving fiber, i.e. a fiber in which no or little optical power is transferred from one polarization mode to another. In the alternative, the optical fiber can also be a polarizing fiber.

In a preferred embodiment, at least one of the gain medium, the reflecting elements or the substrate is structured such as to provide a polarizing effect. This can for example be achieved with a so-called "wire grid" polarizer structure.

The tuneable VCSEL may be operated in an inert gas atmosphere or in a vacuum.

When the gain material is optically pumped, the pumping light may be coupled to the gain medium from the back side, i.e. from the side facing away from the resonator cavity. Herein, the pump light may be coupled to the gain medium by means of a non-guided beam or via a waveguide.

In a preferred embodiment, the pump light is generated by a multi-mode laser diode. However, in alternative embodiments, the gain medium may also be electrically pumped.

In a preferred embodiment, the volume of the gain medium that is optically or electrically pumped is at least twice as large as the volume covered by the optical resonator mode, preferably at least five times as large and most preferably at least 20 times as large.

In order to efficiently dissipate heat from the device, the tuneable VCSEL device is preferably supported by a thermically conductive material. However, the tuneable VCSEL may also comprise means for actively stabilizing the temperature, such as a Peltier element. In addition, the VCSEL device may be sealed by moisture-barrier forming moulding material which may also be a heat conductive material.

While in the preferred embodiment the concave recess is formed in a polymer layer that is directly attached to an optical waveguide or fiber end, in some embodiments the concave recess can also be provided directly in the fiber end, for example by means of laser ablation, etching or polishing.

In yet a further embodiment, the first or second reflecting elements can be formed by a mirror surface that is directly applied to a piezo-electric element forming the first actuator means.

In one embodiment, the VCSEL is pumped with a quantum dot laser.

In one embodiment, the piezo-actuator forming the first or second actuator means has a mass larger than 10 µg, preferably larger than 100 µg and most preferably larger than 1 mg. Also, the minimum dimension of the first or second piezo-actuators in operating direction may be 0.3 mm or more, preferably 1.0 mm or more and most preferably 1.9 mm or more.

In one embodiment, the first and/or second reflecting element, including its carrier substrate may have a thickness of 50 µm or more, preferably of 100 µm or more and most preferably of 1 mm or more. Further, the first and/or second reflecting element may have a diameter of 200 µm or more, preferably of 500 µm or more and most preferably of 1.9 mm or more.

In a preferred embodiment, said first actuator means is directly coupled with said first reflecting element or indirectly coupled with said first reflecting element via a supporting member supporting said first reflecting element.

Herein, the first actuator means is configured to modulate the optical path length between said first and second reflecting elements by a modulation amplitude to thereby sweep the optical resonator cavity through a band of optical resonance frequencies with a sweep frequency of 70 kHz or more, preferably 100 kHz or more and more preferably 200 kHz or more. Herein, the tuneable VCSEL device is further characterized by one or both of the following features:

(a) the mechanical coupling between at least two elements out of the first actuator means, the first reflecting element and the supporting member is sufficiently low such that said at least two elements when operated at said sweep frequency of 70 kHz or more act as a system of coupled oscillating elements, (b) the first actuator means is directly coupled with or indirectly coupled with said first reflecting element via said supporting member such as to substantially drive the first reflecting element only.

Accordingly, this embodiment avoids an MEMS structure but relies on an ordinary mechanical design instead, including a first actuator means that is directly or indirectly mechanically coupled with said first reflecting element. Herein, the first actuator means may for example be a piezo-actuator.

However, the VCSEL device of this embodiment differs from the prior art FFP-TFs of FIGS. 1 and 2 by at least one, preferably both of the above features (a) and (b). According to feature (a) the mechanical coupling between at least two elements out of the first actuator means, the first reflecting element and the supporting member is sufficiently low such that these at least two elements—when operated at said sweep frequency of 70 kHz or more—act as a system of coupled oscillating elements. As will be demonstrated below, the resonances of the individual (but coupled) oscillating elements can be much higher than the resonance of for example the U-shaped filter structure of FIG. 2, therefore allowing large modulation amplitudes at much higher frequencies. Note that the expression "operated at said sweep frequency of 70 kHz or more" means that the tuneable VCSEL device allows for at least one sweep frequency at which the at least two elements act as a system of coupled oscillating elements, and that this at least one sweep frequency is higher than 70 kHz, preferably higher than 100 kHz and most preferably higher than 200 kHz. It shall not mean that this feature holds true for any sweep frequency higher than 70 kHz. Likewise, the feature that the tuneable VCSEL device of the invention can be swept through the band of optical frequencies with the aforementioned high sweep frequencies mainly characterizes the mechanical properties of the FP-TF device, but does not mean that the tuneable VCSEL device must in practice necessarily be operated in a swept mode. Instead, the tuneable VCSEL device may also be operated in an aperiodic and/or stepped tuning mode. But in this case, too, the ability to carry out fast frequency sweeps will lead to short step response times that will be inversely related to the possible sweep frequencies.

Further, according feature (b), the first actuator means is directly coupled with or indirectly coupled with said first reflecting element via said supporting member such as to substantially drive the first reflecting element only, but not the second reflective elements. This is different from both prior art filter designs as shown in FIGS. 1 and 2, where the filter structure is symmetric in the sense that the piezo-actuator is always coupled with both reflecting elements in the same way and will move the two reflecting elements symmetrically with regard to their center of mass.

Note that the expression "substantially drive the first reflecting element only" accounts for the fact that since the first actuator means and the second reflecting means are part of the same structure, they will necessarily be somehow coupled, too, and that strictly speaking in view of the finite masses involved it cannot be excluded that the second reflective element is slightly driven by the first actuator means as well. However, the mass of the first reflecting element and—if present—the supporting member is considerably smaller than that of the remainder of the Fabry-Perot tuneable filter device that for all practical purposes it can be said that the first reflecting element is substantially driven only.

As will be explained below in more detail, each of features (a) and (b) will allow to push the sweep frequency limit considerably higher than in the prior art filters of FIGS. 1 and 2. Preferably, at least one element out of the first actuator means, the first reflecting element and the supporting member when operated at said sweep frequency of 70 kHz or more exhibit one or more of the following:

an independent oscillation amplitude,
a resonance that is attributable to the individual element,
an oscillation phase that is shifted with respect to that of at least one of the other abovementioned elements.

Any of these features is characteristic for elements acting as a system of coupled oscillating elements.

In some cases, independently oscillating elements can be identified by the existence of pronounced nodes with almost zero amplitude within the structure, as will be shown below with reference to FIG. 8(*c*). Equivalently, in traveling mechanical wave structures this would refer to at least one dimension of one of the elements being larger than half the mechanical wavelength.

Note that the "resonance" is the resonance in the response function of the tuneable VCSEL device as a whole, i.e. the response function of the modulation amplitude of the optical path length as a function of driving frequency of the first actuator means. Although this optical path length modulation amplitude does not depend on the oscillation amplitude of the individual element alone, it is seen that in some embodiments of the invention, the resonance in the response function is nevertheless attributable to the oscillation of an individual element as a part of a system of coupled oscillating elements.

Preferably, the resonance that is attributed to one of the first actuator means, the reflecting element and the supporting member has a Q-factor of 3 or more, preferably of 8 or more.

In a preferred embodiment, the amplitude of the oscillation of the first reflective element is larger than that of the first actuator when operated at said sweep frequency of 70 kHz or more. This way, a considerable modulation amplitude of the optical path length can be obtained even at smaller oscillation amplitudes of the first actuator.

In a preferred embodiment, a phase shift between two quantities chosen from a control signal, the elongation of the first actuator means in operation direction, the elongation of the supporting member, and the elongation of the first reflecting element is between 45° and 135°, preferably between 70° and 110°. Herein, no phase shift (i.e. 0 phase) would correspond to an elongation state of two elements that would lead to an identical effect on the optical path length between the first and second reflecting elements. For example, an elongation of the first actuator means that leads to a decrease in the optical path length and an elongation of the supporting member that would lead to a yet further decrease of the optical path length would be considered as being in phase, i.e. having a phase shift of 0°. A phase shift as defined above is indicative of a system of coupled oscillating elements. In particular, a phase shift close to 90° is indicative of an energy transfer between the two coupled oscillating elements that allows for large modulation amplitudes.

Preferably, the resonance frequencies of at least two elements out of the first actuator means, the supporting member and the first reflecting element differ by less than 60%, preferably by less than 30% and most preferably by less than 10%. This allows for an efficient energy transfer between the at least two elements.

In a preferred embodiment, the first reflecting element is formed by a plate that has a free portion that is free to carry out plate vibrations, and a supporting portion where the plate is supported. Herein, the "plate vibrations" refer to vibrations normal to the rest plane of the plate. A freely vibrating plate is one example of a first reflecting element that is loosely coupled with the rest of the filter device. Obviously, the frequencies of the plate vibrations can be much higher than e.g. the resonance of the entire U-shaped structure of the prior art FFP-TF of FIG. 2 as shown in the response diagram of FIG. 3. This is hence a good example of how by loosely coupling at least two elements out of the first actuator means, the first reflecting element and the supporting member a high frequency modulation in the optical path length or, in other words, a high sweep frequency can be achieved.

In a preferred embodiment, the free portion is a central portion and the supporting portion is a circumferential portion at least partially surrounding said central portion of said plate. As will be shown in a specific embodiment below, this arrangement allows for high frequency and high amplitude plate vibrations permitting a very fast frequency sweep over a large frequency range.

In a preferred embodiment, the supporting portion is directly or indirectly supported by said first actuator means. Herein, the expression "directly supported" could for example mean that the plate is glued directly to said first actuator means. However, the supporting portion may also be indirectly supported by the first actuator means via some intermediate element provided therebetween.

In a preferred embodiment, the first actuator means is ring-shaped or comprised of a plurality of actuators arranged along the circumferential portion of said plate. This means that the central free portion of the plate will be driven from the circumferential portion surrounding said central free portion. The inventors could confirm that this way very high oscillations of the free portion can be achieved. Graphically speaking, driving the free portion of the plate from the circumferential portion focuses the energy from the ring-shaped first actuator means or circumferentially arranged plurality of actuators to the center of the free portion, where it leads to very large oscillation amplitudes, which in turn lead to a large modulation amplitude of the optical path length.

In a preferred embodiment, the plate is made from one of glass, quartz, sapphire and diamond. Further, the thickness of the free portion of the plate is preferably 0.02 mm or higher, more preferably 0.05 mm or higher and most preferably 0.1 mm or higher. Alternatively or in addition, the thickness of the free portion of the plate is preferably 2.0 mm or lower, preferably 0.5 mm or lower and most preferably 0.2 mm or lower.

Preferably, the plate has a front side facing the resonator cavity and a back side facing away from the resonator cavity, wherein a fiber focusing means is provided opposite to the back side of the plate such as to focus light exiting from the resonator cavity through said plate into an optical fiber. Note that this design is different from the typical fiber FP-TF as shown in FIGS. 1 and 2, where the light is guided in two fibers substantially along its entire light path except for the resonator cavity. However, since in this embodiment the plate has a free portion that is free to carry out plate vibrations, this prohibits a true fiber FP-TF design. Instead, the light exiting from the resonator cavity through the plate travels some distance without being guided in any waveguide or optical fiber means before it is focused into an optical fiber by means of the fiber focusing means.

Preferably, the fiber focusing means comprises at least one gradient-index (GRIN) lens. A GRIN lens is a lens having a gradual variation of the refractive index of its material. Further, the back side of the plate facing away from the resonator cavity is preferably coated with an anti-reflective coating.

Preferably, the supporting member has a tapered shape, having a larger cross section at its back end and tapering towards the front end thereof. This tapered shape allows for a comparatively large back end surface in relation to the total mass of the supporting member and is hence preferable as compared with, for example, a cylindrical supporting member design. Namely, since the back end surfaces is where the supporting member is attached to the first actuator means, this allows combining a comparatively light weight supporting structure with a first actuator means of a given size and hence mass. In fact, in practice this will allow to provide a supporting member having a mass that is considerably smaller than that of the first actuator means. The weight of the supporting member can be further reduced by manufacturing it from light metals such as aluminum or magnesium. Again, the reduced mass of the supporting member allows for higher sweep frequencies of the tuneable filter device.

The geometry of the supporting member can be further devised such as to display a resonance at an eigenfrequency that is higher than the desired sweep frequency of 70 kHz or more, preferably 100 kHz or more and most preferably 200 kHz or more. For example, the supporting member and the first actuator means may act as a system of coupled oscillators and the oscillation frequency of the supporting member may then lead to a resonance in the response function of the optical path length modulation of the filter device that is attributable to the supporting member oscillations. The desired shape of the supporting member can be established in an electrical discharge machining process, in particular by spark machining, spark erosion or wire erosion. This way, the stiffness and oscillating frequency of the supporting member can be adjusted as desired.

Irrespectively of the detailed design of the VCSEL device, the inventors have noticed that in preferable embodiments, the masses of the first actuator means, the supporting member (if present) and the reflecting elements may fulfill one or more of the following criteria:

the mass of the reflecting element is less than 2 g, preferably less than 0.5 g and most preferably less than 0.05 g, the mass of the reflecting element is smaller than the mass of the first actuator means, preferably at least ten times smaller, most preferably at least 50 times smaller, the mass of the supporting member is smaller than that of the first actuator means, preferably at least 5 times smaller, more preferably at least 10 times smaller, the mass of the first actuator means is less than 10 g, preferably less than 5 g and most preferably less than 2 g, the maximum length of the first actuator means in operating direction is less than 10 mm, preferably less than 3 mm and most preferably less than 1 mm. Herein the expression "operating direction" is the direction of the first actuator means in which any extension or contraction leads to a modulation of the optical path length in the resonator cavity, the maximum length of the first actuator means in operating direction is less than its dimensions in any direction perpendicular to said operation direction.

Note that when the individual components first actuator means, supporting member and first reflecting element act as a system of coupled oscillators, it is not always the total mass of the respective component that governs the resonance frequency, but rather the mass that is actually moved during oscillation. For example, with reference to the oscillating plate design, the resonance frequency will depend on the mass of the free portion of the plate rather than on the total mass of the plate, which may have sections that are not involved in the oscillation at all. Accordingly, in a preferred embodiment the amplitude weighted mass of the reflecting element defined as the integral of the product of the local peak-to-peak displacement $A(x,y,z)$ times the mass element $d_m$, with A normalized such that the volume integral over all $x,y,z$ of the function $A(x,y,z)$ is 1, is less than 20 mg, preferably less than 5 mg and most preferably less than 1 mg.

As mentioned before, in preferred embodiments, the first actuator means is a piezo-actuator and in particular, a lead-zirconate-titanate actuator. The first piezo-actuator is preferably ring-shaped with a hole having a diameter of 0.2 to 8.0 mm, preferably of 0.6 to 3.5 mm and most preferably of 0.7 to 2.1 mm. In one embodiment, the first piezo-actuator is operated at said sweep frequency with 0.1 to 50% of its maximum elongation.

In a preferred embodiment, the maximum possible modulation amplitude provided by the first piezo-actuator at said sweep frequency is at least 100 nm, preferably at least 500 nm and most preferably at least 1 µm. In a preferred embodiment, the first piezo-actuator comprises a single ceramic layer.

In a preferred embodiment, the tuneable VCSEL device comprises a second actuator means for providing an optical path length modulation at low frequencies. Herein, the expression "low frequency" means a frequency that is below the aforementioned sweep frequency, for example at a frequency as low as 200 Hz. Such low frequency operation is also referred to as "DC operation" herein. The second actuator means is preferably a second piezo-actuator, in particular a lead-zirconate-titanate piezo-electric element.

The second actuator means can be used for calibrating the cavity length to a desired mean value, while the first actuator means is employed to modulate the cavity length with regard to this mean value. This way, drifts in the cavity length can be compensated by the second actuator means, while the entire stroke available from the first actuator means can be used for the modulation.

Preferably, the modulation amplitude provided by the second actuator means at low frequencies is at least 100 nm, preferably at least 500 nm and most preferably at least 1 µm.

When the second actuator means is formed by a second piezo-actuator, its length in operation direction is preferably more than 0.5 mm, preferably more than 1.0 mm and most preferably more than 1.9 mm. The second piezo-actuator is preferably a multi-layer piezo electric actuator.

Preferably, the first and second actuator means are operated by means of two separate electrical circuits.

When the first and/or second actuator means are formed by a piezo-actuator, the Curie temperature is preferably more than 180° C. This will permit soldering connections with the piezo-actuator. Also, this will prevent that the operation is compromised when the piezo-actuators heat up during operation.

In a preferred embodiment, the tuneable VCSEL device comprises driving means for driving the first actuator means. Herein, the driving means may comprise a microcontroller, hard-wired circuitry or both.

In a preferred embodiment, the driving means is adapted to drive the first actuating means at a resonance frequency of the response function of the optical path length modulation of the FP-TF device. As will be shown below, this resonance may be attributable to one of the first actuator means, the supporting member or the first reflecting element. So in some cases it can also be said that the driving means is adapted to drive the first actuator means at the resonance of the first actuator means, the support member or the reflecting element, respectively.

In one embodiment, the driving means is adapted to drive the first actuator means with a harmonic, i.e. sinusoidal signal corresponding to a ground resonance of the tuneable VCSEL device. This will lead to large modulation amplitudes of the optical path.

In a preferred embodiment, the driving signal of the driving means may contain components of the higher harmonics of the ground resonance, in particular the third harmonics. By a suitable combination of the ground resonance and its higher harmonics, the wavelength sweep can be to some extent linearized in that the optical path length modulation is more similar to a triangle waveform rather than a purely sinusoidal waveform.

In one embodiment, the first actuator means is a piezo-actuator, and the driving means comprises an inductivity that is provided in parallel to the piezo-actuator. Since the piezo-actuator has a considerable capacitance, the inductivity provided in parallel to the piezo-actuator forms an LC-parallel-oscillator circuit that can be adjusted to the desired driving frequency.

Also, the driving means may comprise an LC-series-oscillator circuit connected in series with the first actuator means, where the LC-series circuit is adjusted to the desired driving frequency. If it is intended to drive the first actuator means with a superposition of different frequencies, then a number of corresponding LC-series circuits can be provided in parallel to each other, but each in series with the first driving means.

Also, in order to add a constant bias to the driving signal without disturbing the other components, the driving means may comprise a bias-T circuit with an AC-input and a DC-input.

Each of the features and constructive details can be employed in all possible combinations.

SHORT DESCRIPTION OF THE FIGURES

FIG. 6(*b*) shows a detailed view of the portion of FIG. 6(*a*)

Figure 12:
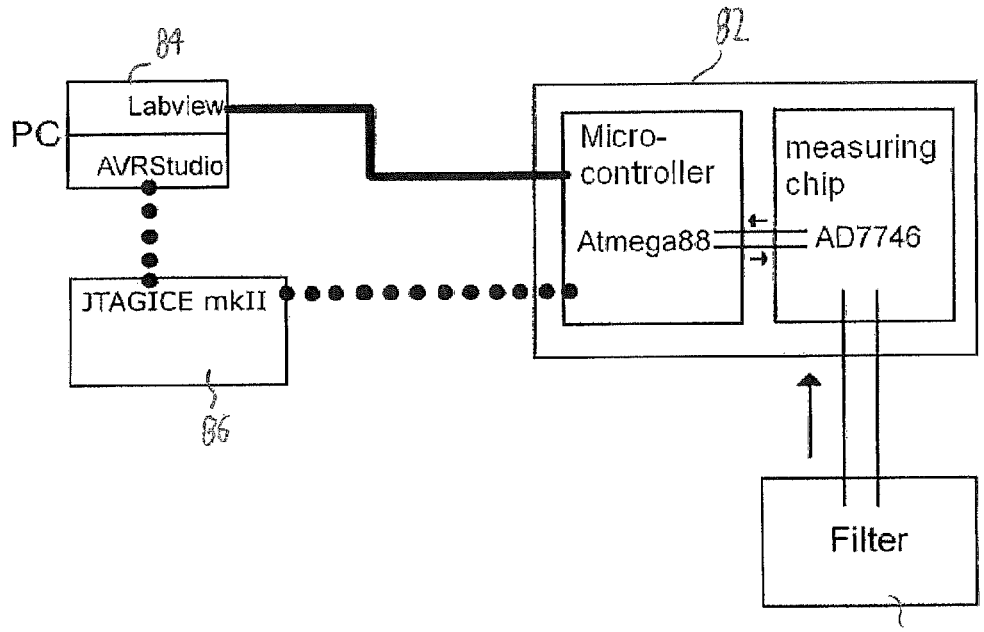
Figure 13:
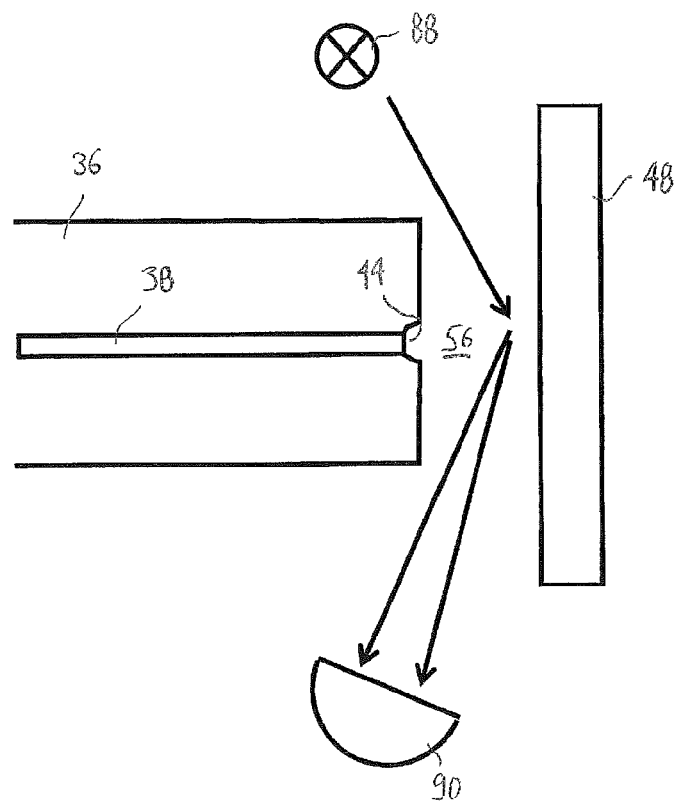
Figure 14:
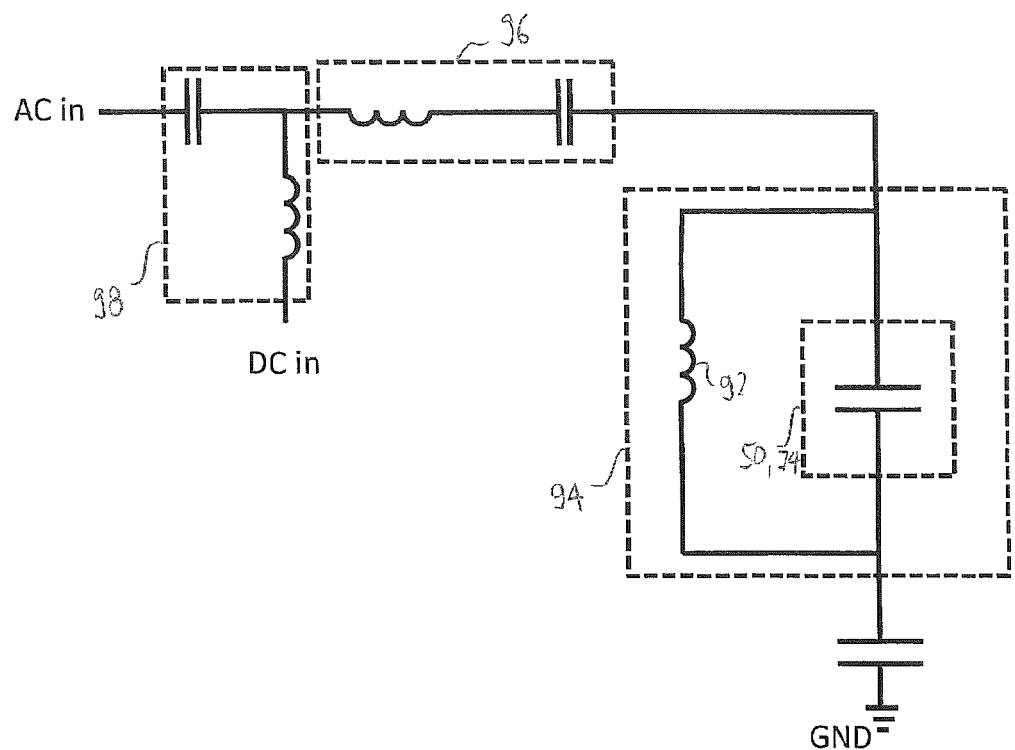
Figure 15:
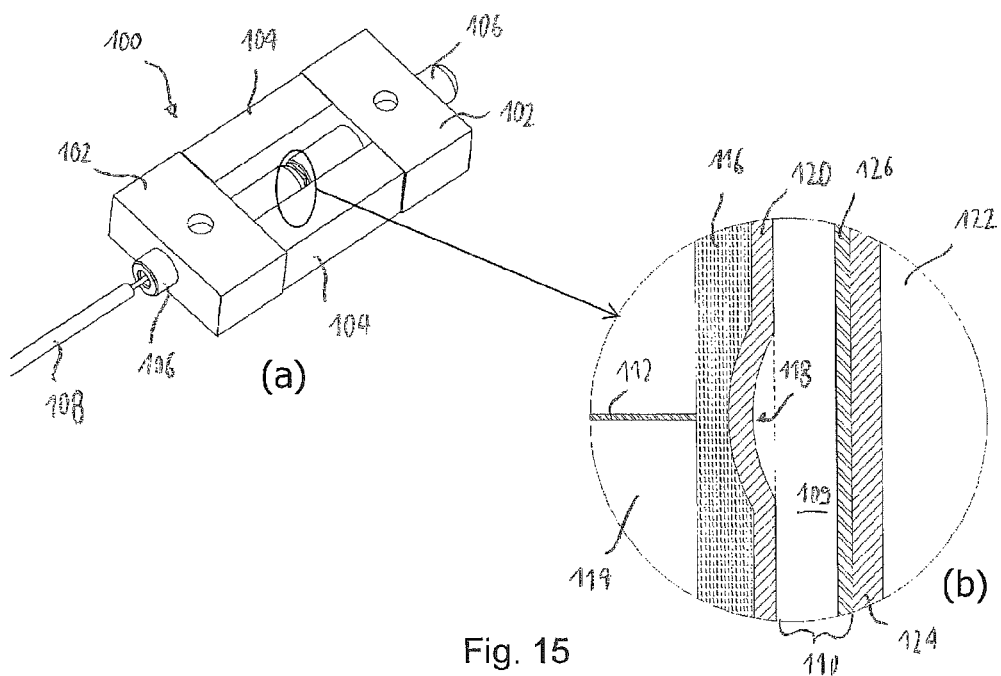
Figure 16:
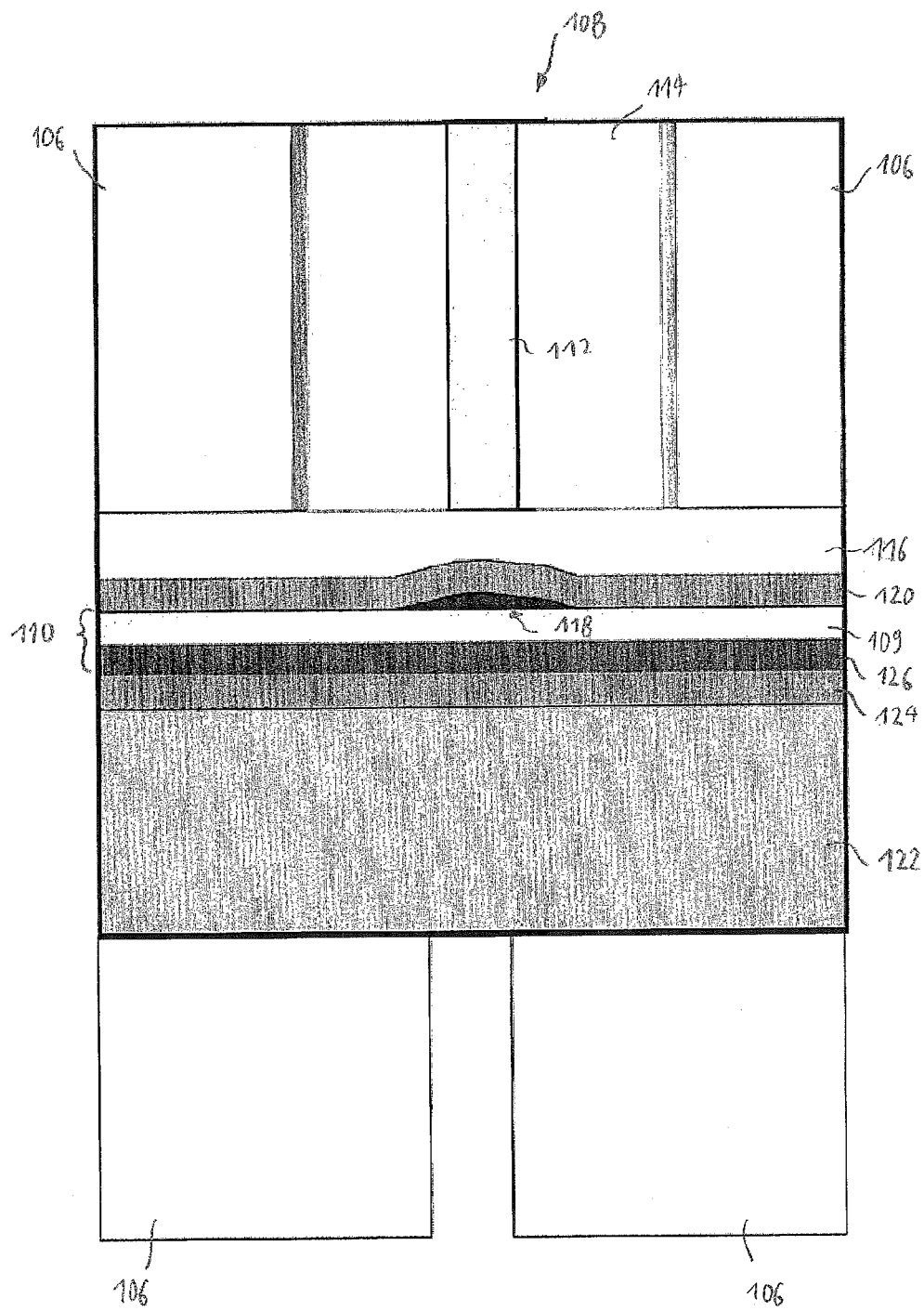

FIG. 12 is a schematic diagram illustrating a capacitive wavelength calibration scheme FIG. 13 is a schematic diagram illustrating an optical wavelength calibration scheme FIG. 14 is an equivalent circuit for operating the first piezoelectric actuator means in one of the first or second examples FIG. 15(a) is a perspective view of a tuneable VCSEL, FIG. 15(b) is a sectional close-up view of the resonator cavity of the tuneable VCSEL of FIG. 15(a), FIG. 16 is a schematic sectional view of a portion of the tuneable VCSEL of FIG. 15(a), not drawn to scale.

Figure 17:
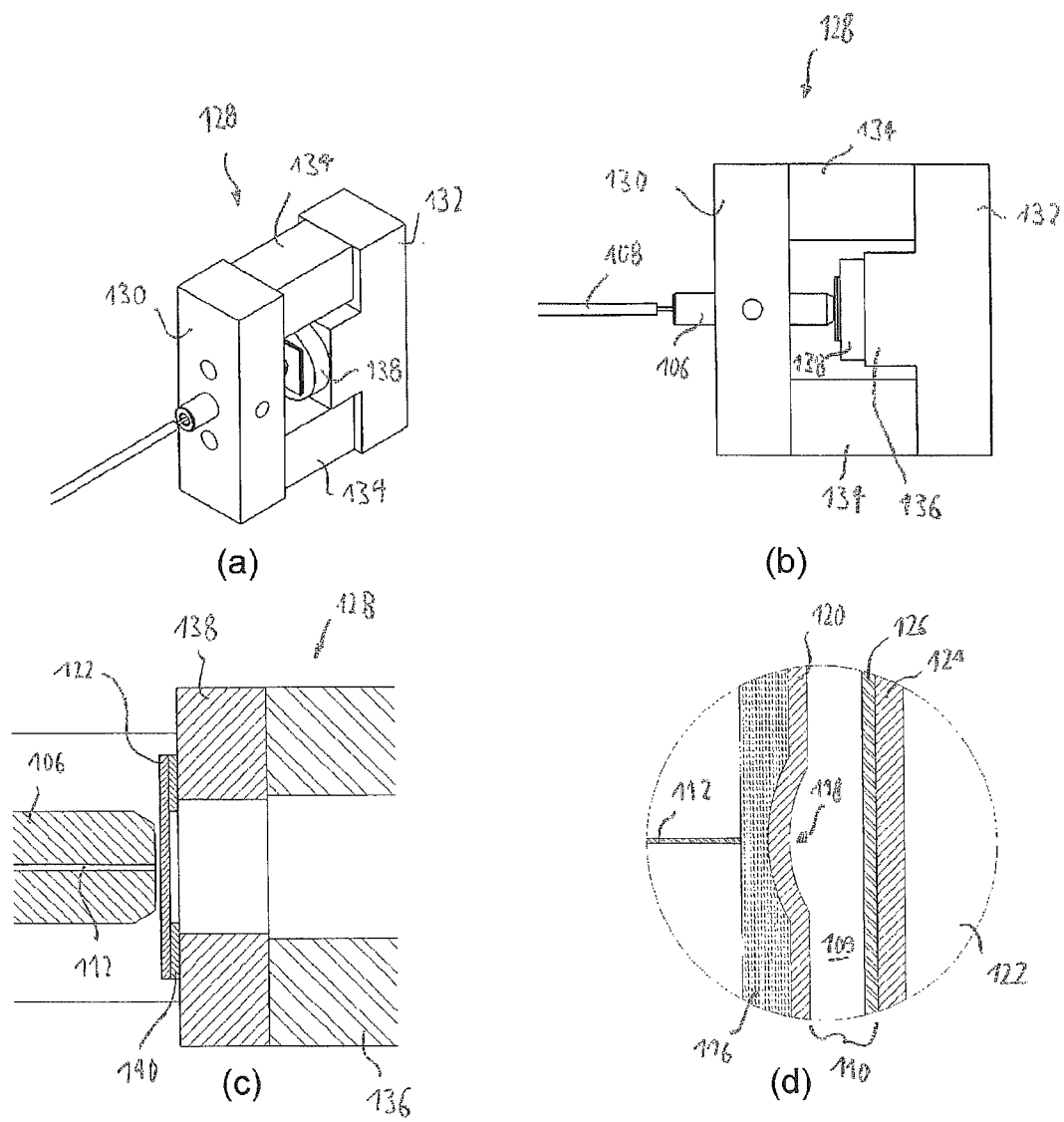
Figure 18:
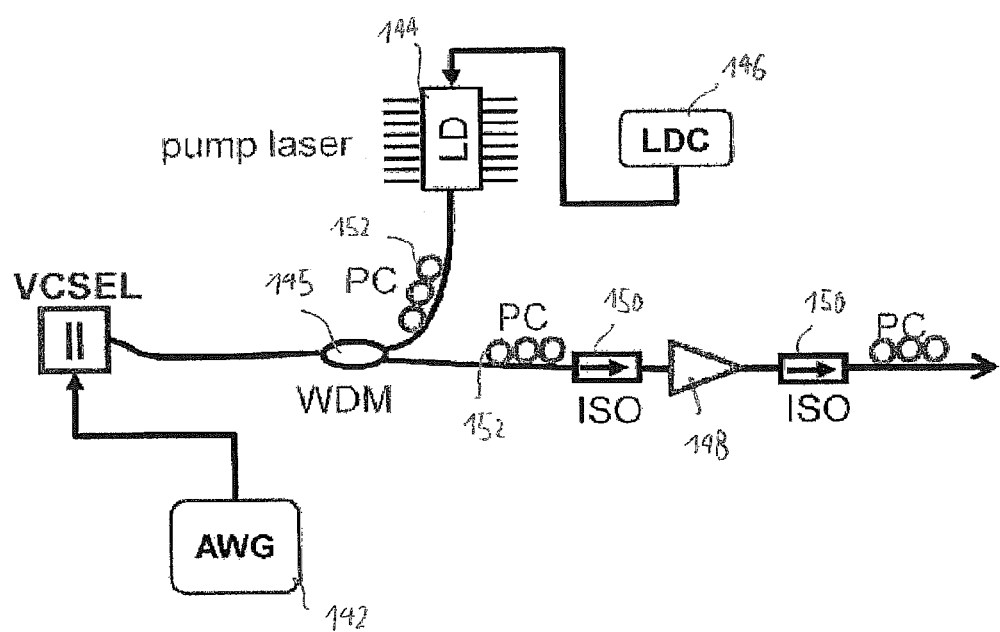

FIG. 17(a) is a perspective view of a further tuneable VCSEL allowing for high sweep frequencies, FIG. 17(b) is a side view of the tuneable VCSEL of FIG. 17(a), FIG. 17(c) is a sectional view of a part of the tuneable VCSEL of FIG. 17(a), FIG. 17(d) is a sectional enlarged view showing the resonator cavity of the tuneable VCSEL of FIG. 17(a), and FIG. 18 shows an implementation of the tuneable VCSELs of FIGS. 15 and 17.

DESCRIPTION OF THE PREFERRED EMBODIMENTS

For the purposes of promoting an understanding of the principles of the invention, reference will now be made to the preferred embodiments illustrated in the drawings and specific language will be used to describe the same. It will, nevertheless, be understood that no limitation of the scope of the invention is thereby intended, such alterations and further modifications in the illustrated device and such further applications of the principles of the invention as illustrated therein being contemplated as would normally occur now or in the future to one skilled in the art to which the invention relates.

Figure 4:
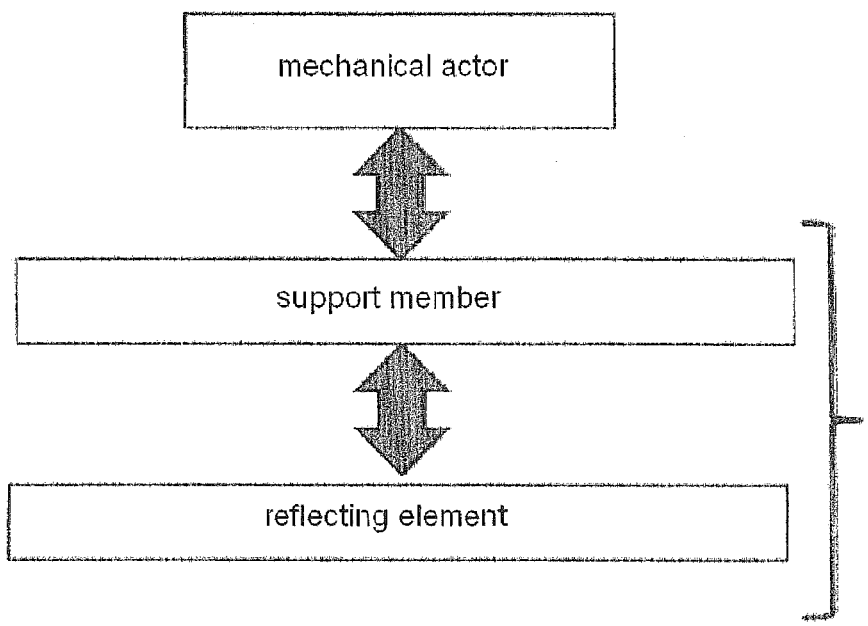
FIG. 4 is a schematic diagram illustrating the key components of the Fabry-Perot tuneable filter device FIG. 5(*a*) is a perspective view of an FP-TF device FIG. 5(*b*) is a side view of the FP-TF device of FIG. 5(*a*)

FIG. 4 summarizes the general components of an FP-TF device which by itself is not an embodiment of the invention, because it does not have a gain medium that is provided in the resonator. Nevertheless, the description of FP-TP devices with reference to FIGS. 4 to 11 is also illustrative for the understanding of rapidly tuneable VCSELs according to some embodiments of the invention. Namely, as explained in the introductory part of the specification, a (passive) Fabry-Perot tuneable filter operating as a band pass filter and a tuneable VCSEL are very similar in many respects, which is why the tuneable VCSEL is regarded as a specific example of a "Fabry-Pérot tuneable filter device" in the wording of the present disclosure. The main difference is that the resonator cavity of the VCSEL comprises a gain medium which is missing in a FP-TF device acting as a passive band pass filter only. Also, in a VCSEL it is sufficient to have one optical fiber or the like for coupling the light out of the resonator cavity, while in a FP-TF device acting as a passive band pass filter, there will usual-ly, but not always be one optical input and one optical output (namely, apart from some reflective type of FP-devices described in prior art).

As is shown in FIG. 4, the FP-TF device comprises a mechanical actor that may for example be a piezo-electric element. The mechanical actor is either directly coupled with a reflecting element or indirectly coupled with said reflecting element via a supporting member supporting said reflecting element. In some cases, no supporting member is employed, or the supporting member can be regarded as part of the reflecting element, which is why the two entities are symbolically combined by a bracket in FIG. 4. For example, if the reflecting element is a glass plate that is directly attached to the mechanical actuator, there is no separate supporting member or the supporting member can be regarded as integral part of the glass plate.

While specific examples will be described below, various embodiments generally allow for higher frequencies of the tuneable filter by employing one or both of two features that can already be explained with reference to FIG. 4. According to the first feature (a), the mechanical coupling between at least two elements out of the mechanical actuator, the supporting member and the reflecting element is sufficiently low such that said at least two elements when operated at a given sweep frequency of 70 kHz or more act as a system of coupled oscillating elements.

According to the second feature (b), the actuator means is directly coupled or indirectly coupled via the supporting member with one reflecting element, referred to as the "first reflecting element" herein, such as to substantially drive this first reflecting element only. This is different from conventional designs where the mechanical actuator is symmetrically coupled to both reflecting elements forming the resonator cavity.

Figure 5A:
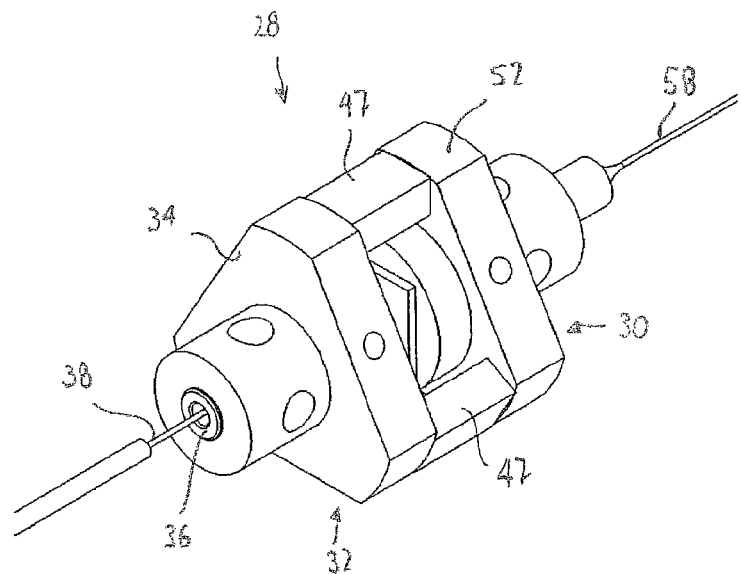
Figure 5B:
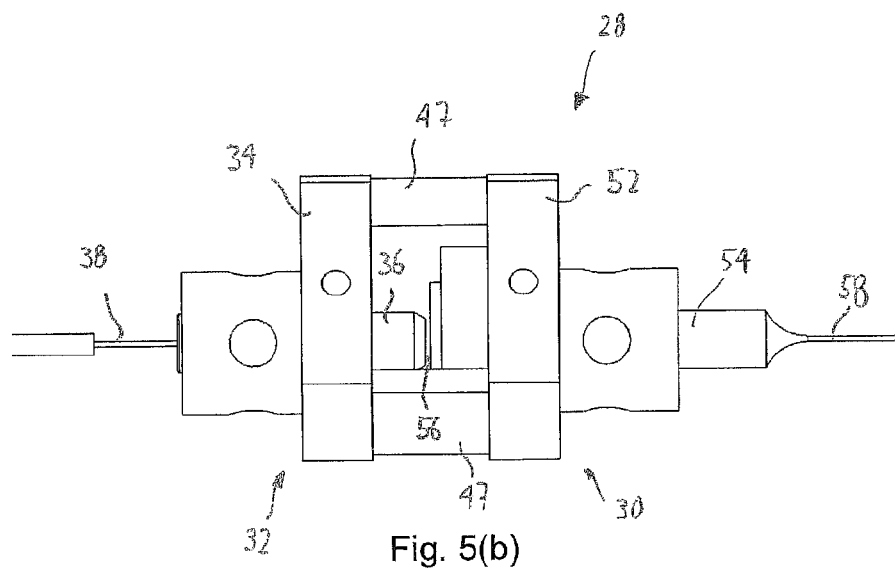
Figure 6A:
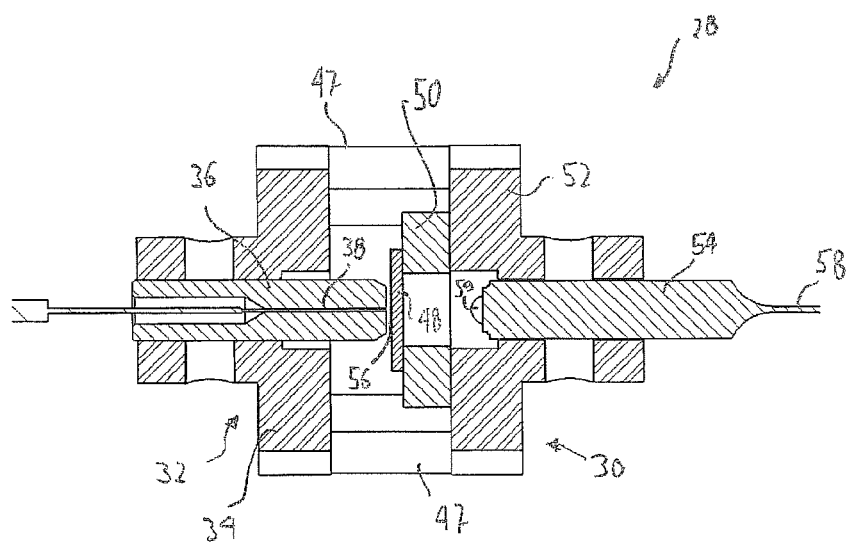
FIG. 6(*a*) is a sectional view of the FP-TF device of FIG. 5(*a*)

A first example of an FP-TF device 28 will be described with reference to FIGS. 5(a) to 6(b). Herein, FIG. 5(a) shows a perspective view of the FP-TF device 28, FIG. 5(b) a side view of the FP-TF device 28 and FIG. 6(a) a sectional view of the FP-TF device 28. FIG. 6(b) is an enlarged portion of the sectional view of FIG. 6(a).

Figure 1:
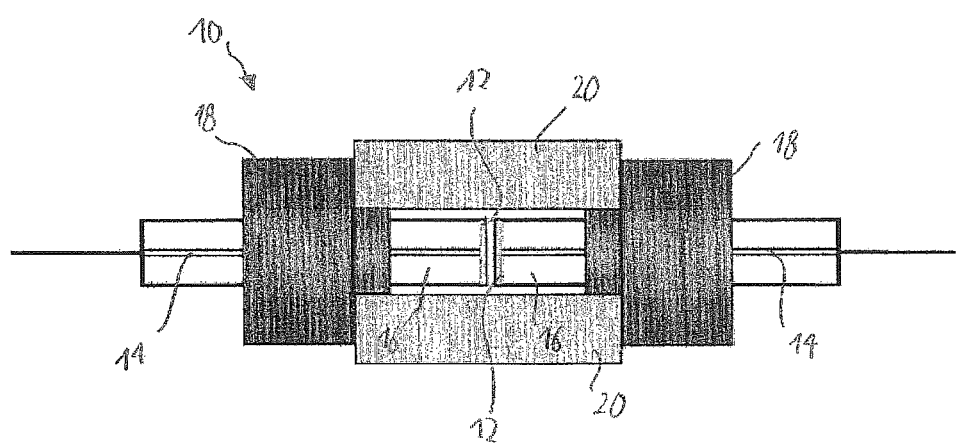
FIG. 1 is a schematic sectional view of a prior art fiber Fabry-Perot tuneable filter (FFP-TF)

As is best seen in the sectional view of FIG. 6(a), the FP-TF device 28 of the first example is comprised of two parts, a first part 30 and a second part 32. The second part 32 is very similar to one half of an ordinary fiber FP-TF as shown in FIG. 1 and shall therefore be described first. The second part 32 comprises a second holding frame 34 which may be made from aluminum. The second holding frame 34 supports a ferrule 36 which in turn supports a second optical fiber 38. A second reflective surface 40 is provided at the end of the second optical fiber 38 which is best seen in the enlarged view of FIG. 6(b). As is seen in FIG. 6(b), the second reflective surface 40 is comprised of a polymer material layer 42, in which a concave recess 44 is formed. The polymer layer 42 including the concave recess 44 is provided with a dielectric reflective surface 46. As explained in the introductory portion, this dielectric reflective surface 46 may in particular be a double-chirped mirror surface. The concave recess 44 can be formed by laser ablation of the polymer material layer 42. In the alternative, the concave recess 44 may also be formed by forming a mechanical indent in the polymer material layer 42.

As is further seen best in FIG. 6(a), the first part 30 and the second part 32 are spaced from each other via second piezo-actuators 47 which allow controlling the distance between the first and second parts 30 and 32. While this looks similar to the prior art design of FIG. 1, importantly, the second piezo-actuators 47 are not used for the modulation of the resonator cavity length, but only for adjusting the mean resonator cavity length such as to compensate for drifts and the like. Instead, for modulating the resonator cavity length, the first part 30 comprises a glass plate 48 having a free central portion that is free to carry out vibrations and having a supporting portion that is circumferential to the free portion and at which the plate 48 is supported by a first actuator means, which in the shown example is a piezo-actuator ring 50.

In the shown example, the glass plate 48 has a thickness of about 0.2 mm. Instead of glass, other materials could also be used, such as quartz, sapphire or diamond. The first piezo-actuator 50 is attached to a first holding frame 52 that may also be made from aluminum. The first holding frame 52 supports a fiber focusing means 54 that receives light transmitted from the resonator cavity 56, i.e. the air gap formed between the second reflective surface 40 and the glass plate 48 (see FIG. 6(b)) through the plate 48 and focuses it into a first optical fiber 58. Herein, as in each of the further examples described below, the first and second optical fibers may be polarization maintaining or polarizing fibers or oligo mode fibers.

The back side of the plate 48, i.e. the side facing away from the resonator cavity 56 is coated with an anti-reflective coating. Further, the fiber focusing means 54 preferably comprises a gradient index lens 59 for focussing the light into the first optical fiber 58.

Figure 2:
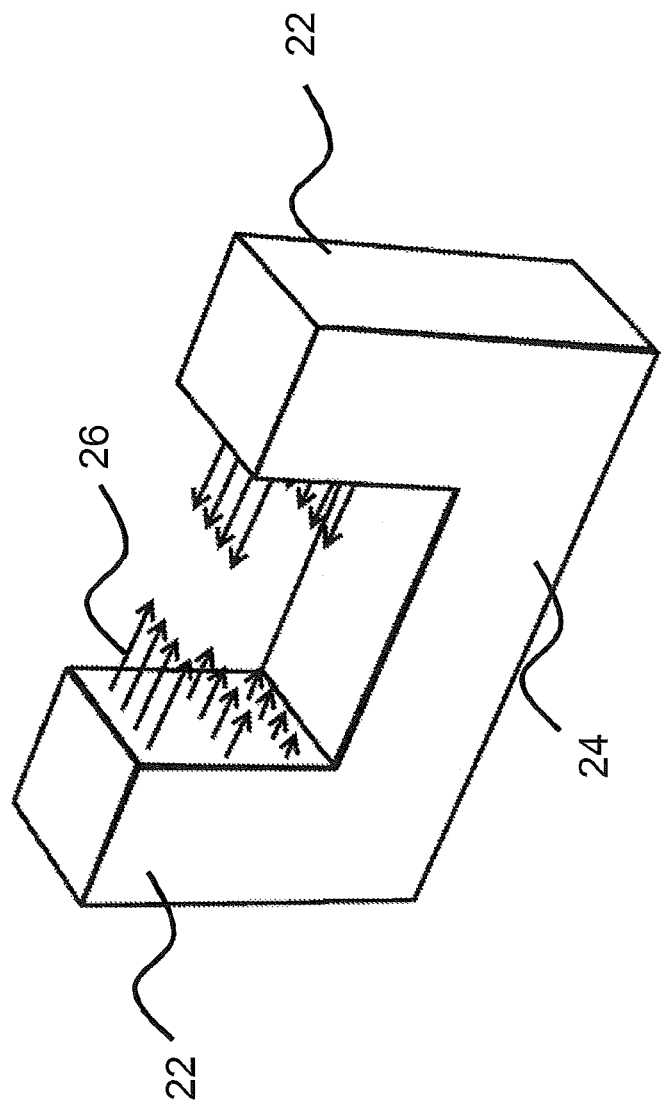
FIG. 2 is a schematic perspective view of a prior art U-shaped FFP-TF design with arrows indicating the oscillation amplitude of the entire filter structure
Figure 3:
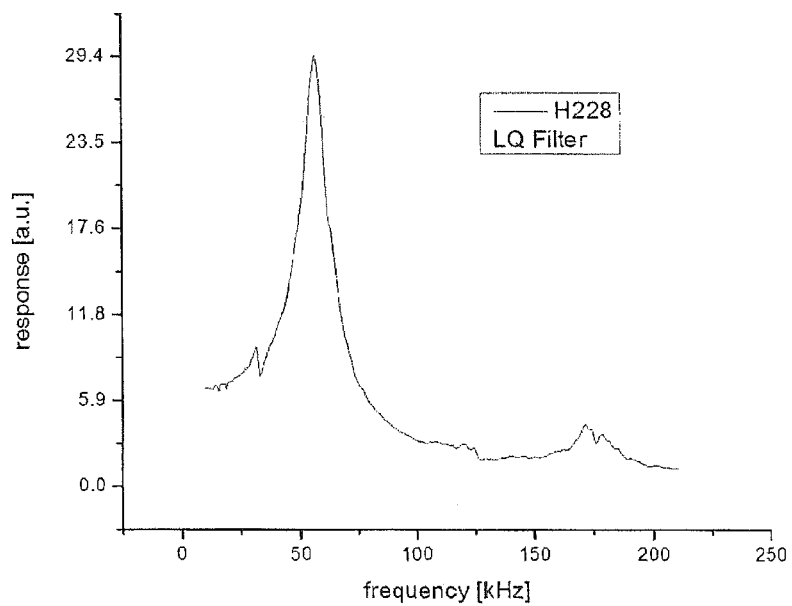
FIG. 3 shows the response function of the U-shaped FFP-TF design of FIG. 2

In FIGS. 5(a) to 6(b), the FP-TF device 28 according to the first example differs from the prior art device of FIGS. 1 and 2 by both of the aforementioned features (a) and (b). Namely, the first reflective element, i.e. the plate 48 is only loosely coupled to the first piezo-actuator 50 so that both of these elements may act as a system of coupled oscillating elements, as will be shown in more detail below. Since the resonances of the individual oscillating elements are at much higher frequencies than the resonances of an entire bulky device such as a U-shaped filter structure of FIG. 2, much higher sweep frequencies can be obtained.

Further, it is seen that the first piezo-actuator 50 is coupled with the first reflective element, i.e. the plate 48 only, such that the plate 48 is substantially driven by the first piezo-actuator 50 only. Herein, the term "substantially" shall again indicate that of course the second ferrule 36 is also remotely coupled with the first piezo-electric actuator 50, but that due to the much higher moment of inertia of the structure inbetween, this will not lead to any significant movement of the second ferrule 36.

Figure 7:
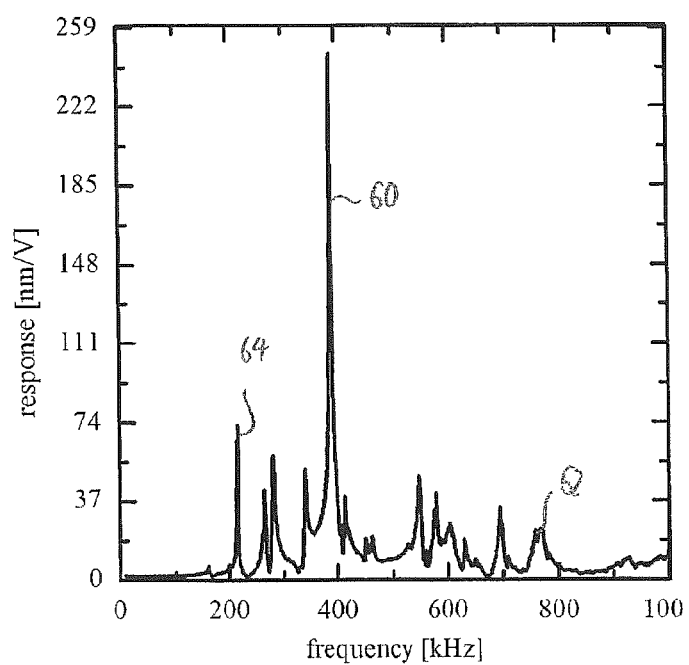
FIG. 7 is a diagram showing the response function of the FP-TF device similar to the one of FIG. 5(*a*)

FIG. 7 shows the frequency response of the optical path length modulation as a function of driving frequency of the first piezo-actuator 50 recorded for an FP-TF device similar to the FP-TF device 28 of FIGS. 5(a) to 6(b). As is seen in FIG. 7, the response function shows a number of resonances with very high Q-factors at frequencies beyond 200 kHz. This means that the FP-TF filter can be easily operated at such high frequencies.

Figure 8A:
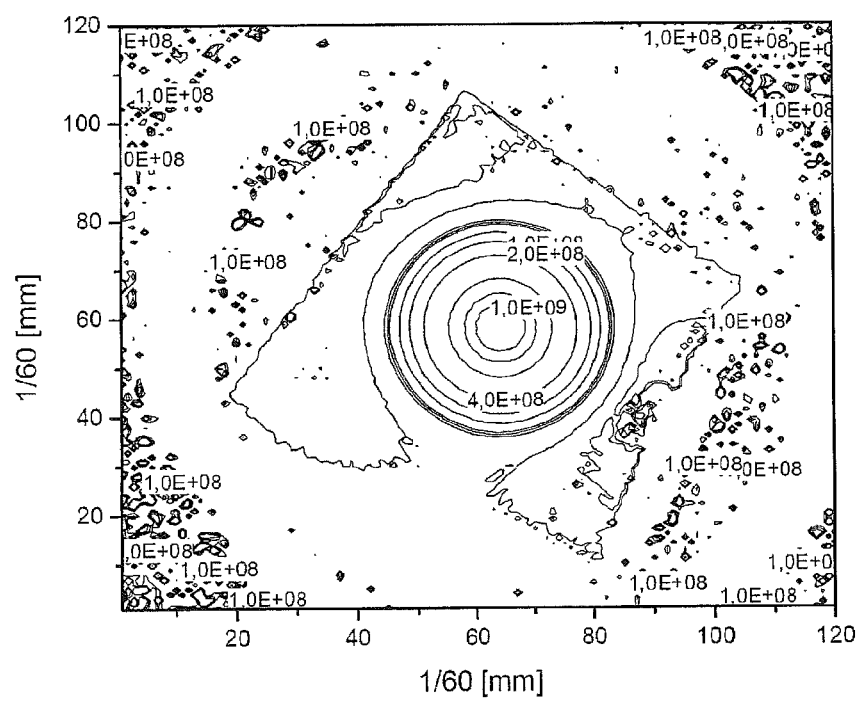
FIG. 8(a) is a contour plot showing the elongation or excursion of the glass plate acting as the first reflecting element in the FP-TF of FIG. 5(a) at a driving frequency of 397 kHz
Figure 8B:
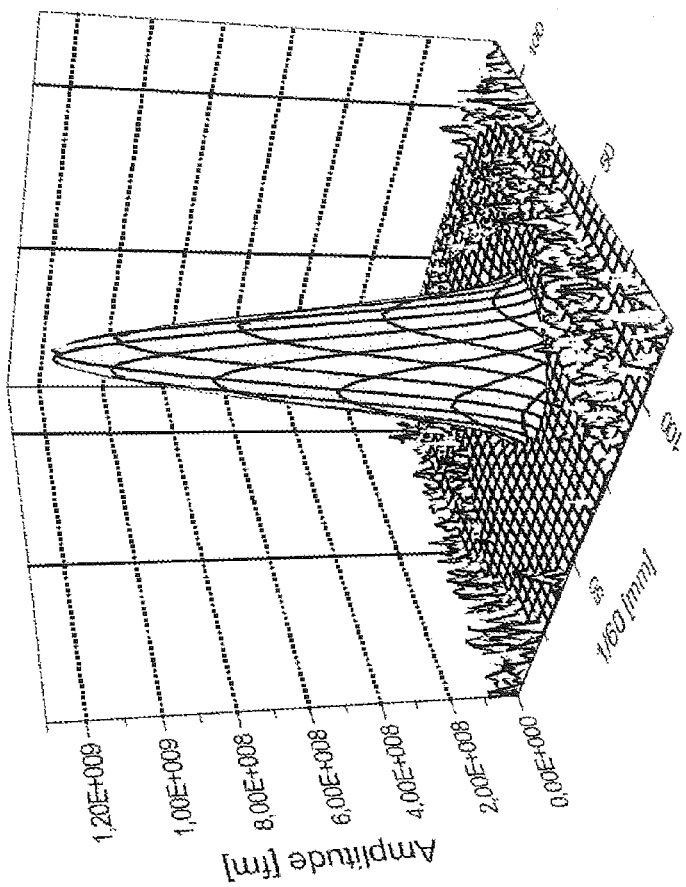
FIG. 8(b) is a 3D-plot showing the same data as FIG. 8(a)

In particular, the response function shows a very sharp peak at about 397 kHz, which corresponds to the base mode of the oscillating plate 48. This has been confirmed by the inventors in an interferometric measurement of a space resolved detection of the mechanical oscillations, the results of which being summarized in FIGS. 8(a) to 9(b). In particular, FIG. 8(a) shows the oscillation amplitude of the glass plate 48 at a driving frequency of 397 kHz in a contour plot, and FIG. 8(b) shows the same data in a 3D-plot. As is seen in FIG. 8(a), (b), in the base mode the center of the plate 48 exhibits very large oscillations with an amplitude of approximately 1 μm. This means that in this base or ground oscillation mode, the length of the resonator cavity 56 can be modulated easily with an amplitude of 1 μm at approximately 400 kHz, thereby combining a very high operation frequency with a large tuning range.

Figure 8C:
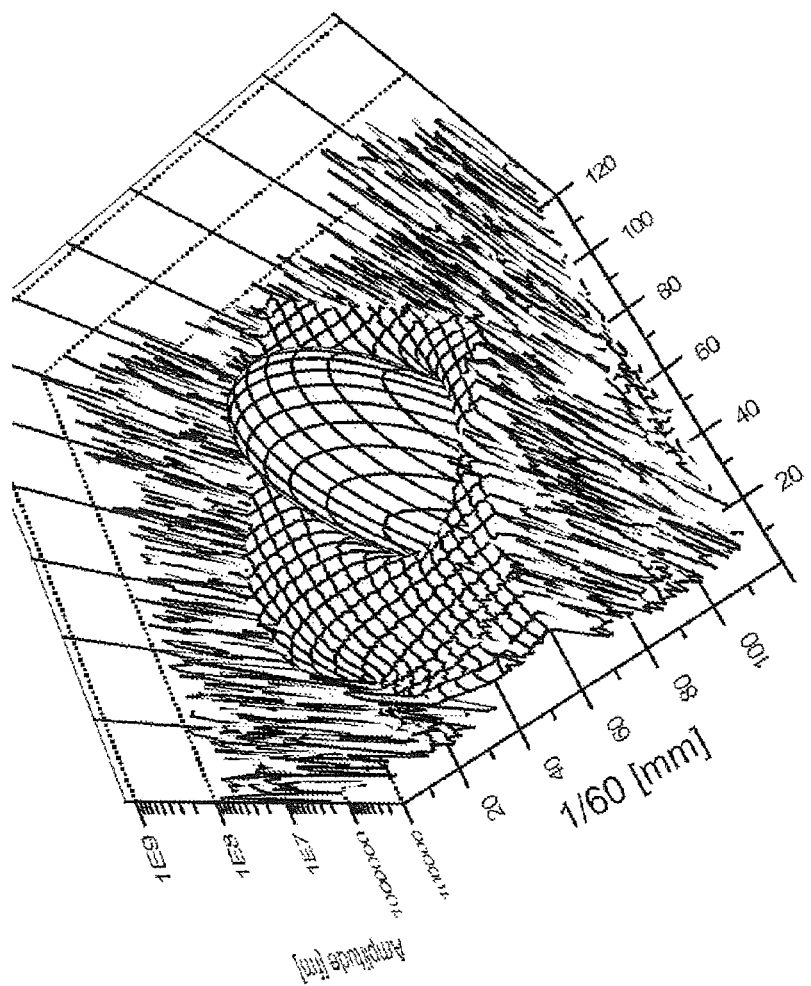
FIG. 8(c) is another 3D-plot showing the same data as FIG. 8(a) but with a logarithmic Z-axis FIG. 9(a), (b) show similar data as FIGS. 8(a), (b) but at a driving frequency of 745 kHz

FIG. 8(c) shows the same data as FIGS. 8(a) and 8(b) but with a logarithmic Z-axis in which a circular node line can be better discerned.

Figure 9A:
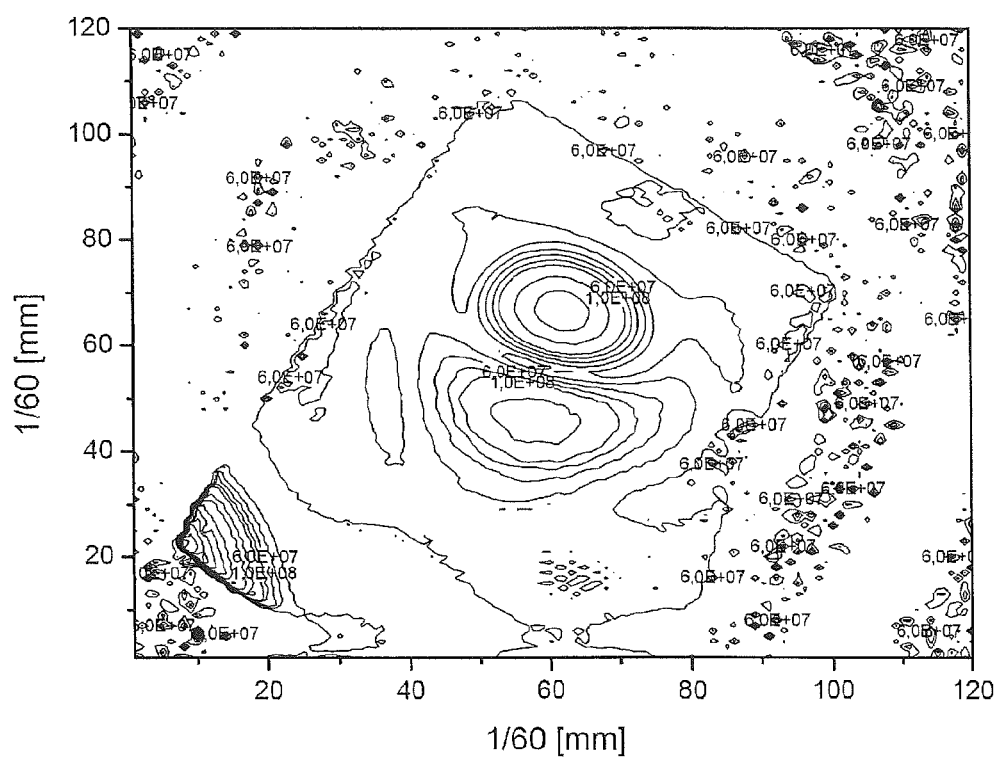
Figure 9B:
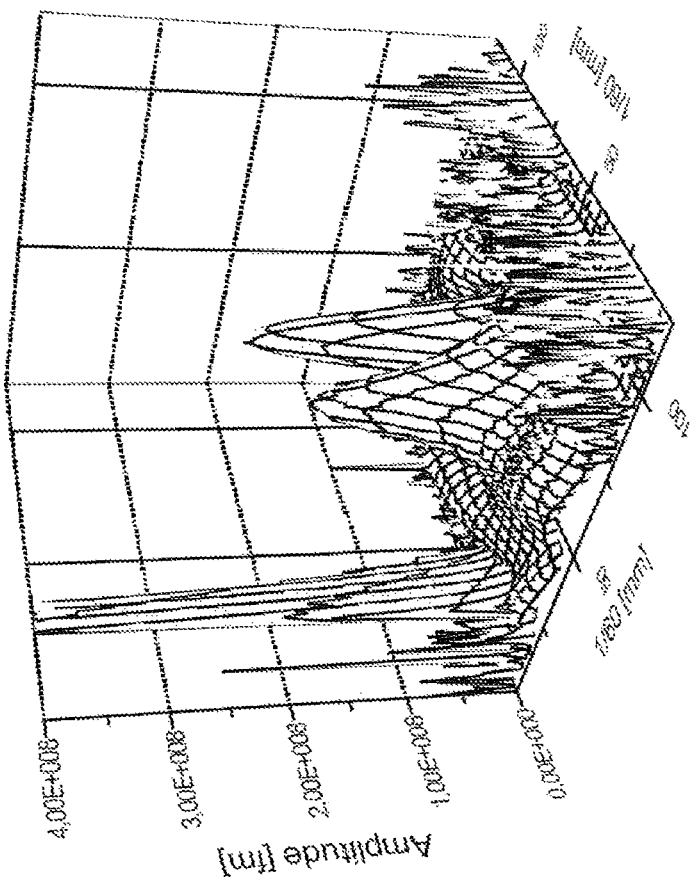

Turning back to FIG. 7, the response function exhibits a number of further peaks and importantly, exceeds the DC value for the entire frequency range of 100 kHz to 1 MHz. The additional peaks at frequencies higher than the 397 kHz are due to the higher harmonic vibrations of the plate. To give an example, FIGS. 9(a) and 9(b) show the contour plot and the 3D-plot of the plate elongation at a driving frequency of 745 kHz, i.e. corresponding to the peak 62 in FIG. 7 which turns out to be the second harmonic. Importantly, the first piezo-actuator 50 may be driven at several harmonic frequencies, in particular the first and the third harmonic, whereby the frequency sweep can be "linearized". That is to say, by adding higher harmonics, the modulation of the resonance frequency can be made more similar to a triangle function than a sinusoidal modulation in time that occurs if only the ground harmonic oscillation is excited.

Finally, the response function of FIG. 7 also shows the resonances of the ring-shaped first pie-zo-actuator 50. For example, peak 64 corresponds to the ground vibration in operating direction, i.e. in thickness direction of the piezo-actuator ring 50. Further peaks below the 397 kHz ground mode of the plate 48 are attributable to other resonances of the first piezo-actuator ring 50.

So in summary, it can be seen from the response function of FIG. 7 that the plate 48 and the first piezo-actuator 50 act as a system of coupled oscillators indeed, and that the individual resonances of these coupled oscillators can be used to obtain a fast modulation of the resonator cavity length as a whole. Again, since the resonance frequencies of these individual components are much higher than that of a bulky device as a whole, much higher modulation frequencies can be obtained.

The performance can be further improved if the resonance frequencies of the first actuator means and the first reflecting element or the supporting member are adjusted to each other, so that the energy transfer from one element to the other is enhanced. Preferably, the ground mode resonances of at least two elements among the first actuator means, the supporting member (if present) and the first reflecting elements differ by 60% or less, preferably by 30% or less and most preferably by 10% or less.

Figure 10A:
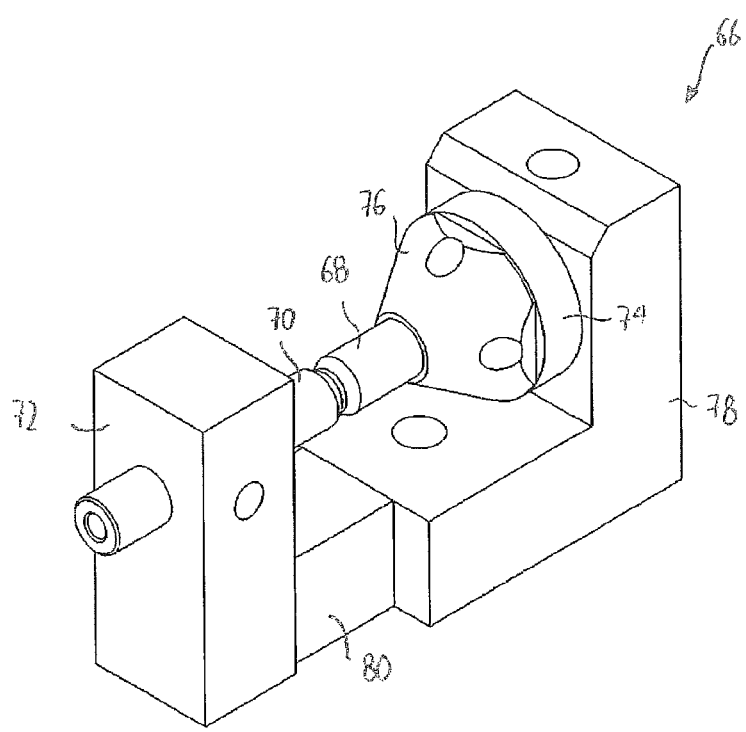
FIG. 10(a) is a perspective view of a second example of a FP-TF
Figure 10B:
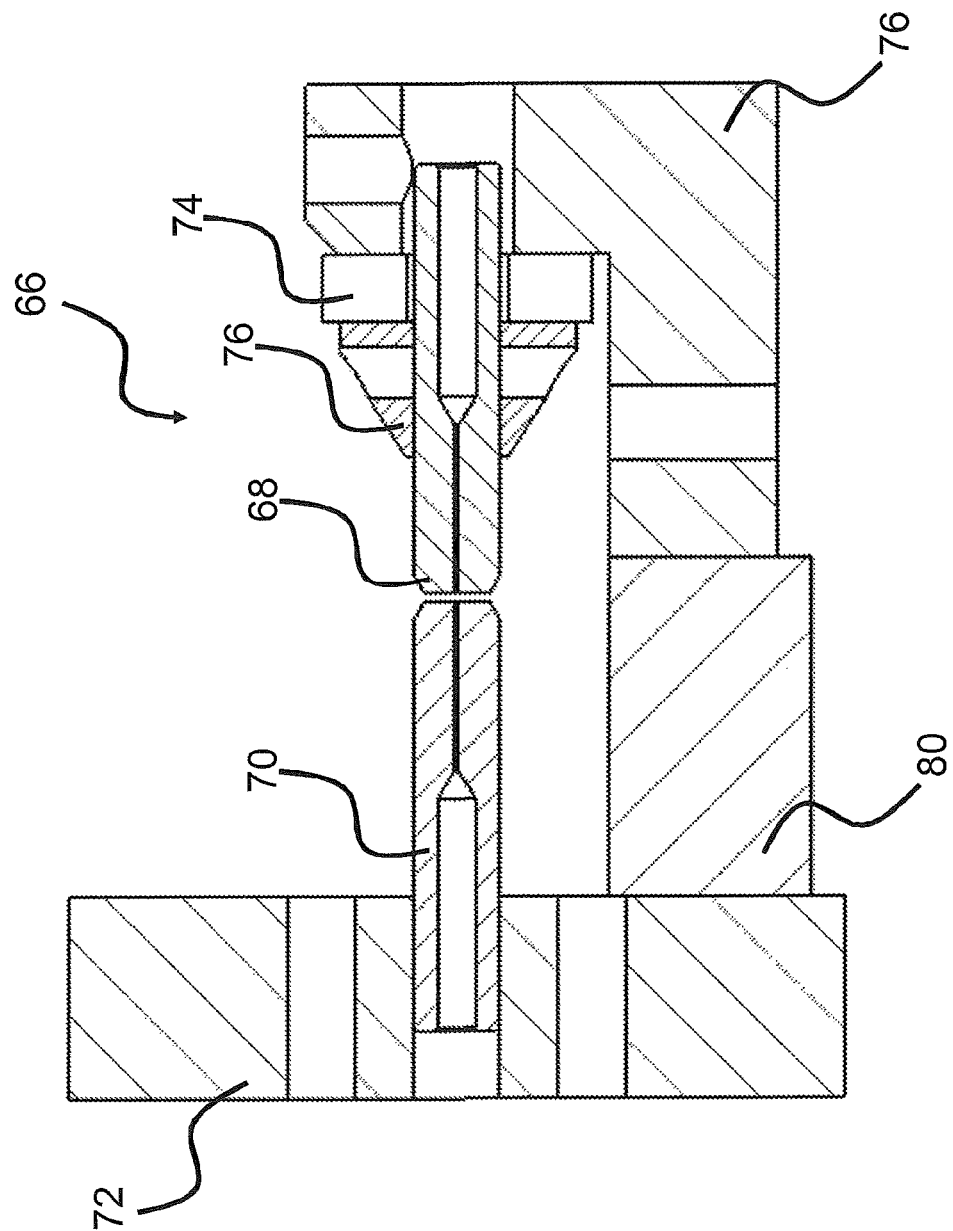
FIG. 10(b) is a sectional view of the second example of the FP-TF according to FIG. 10(a)

Next, a second example of the FP-TF device will be explained with reference to FIGS. 10(a) and (b). FIG. 10(a) shows a perspective view of a FP-TF device 66 according to a second example. The FP-TF device 66 of the second example is a fiber FP-TF device, including a first and a second optical fiber (not shown in FIG. 10(a), (b) for simplicity) that are housed by first and second ferrules 68, 70, respectively. The second ferrule 70 is fixedly mounted in a second frame member 72. The first ferrule 68 is coupled with a ring-shaped first piezo-actuator 74 via a conical supporting member 76. The back side of ring-shaped first piezo-actuator 74 is mounted to a first frame member 78. The distance between the first and second frame members 78, 72 can be adjusted by means of a second piezo-actuator 80 which, however, is not employed for modulating the resonator cavity length in the frequency sweeps. Instead, similar to the second piezo-actuators 47 of FIGS. 5 and 6, the second piezo-actuator 80 is only used for wavelength calibration and drift compensation, while for modulating the resonator cavity length, the ring-shaped first piezo-actuator 74 is employed. Accordingly, the conical supporting member 76 and the first ferrule 68 in combination form the "supporting member" referred to in the summary of the invention and in FIG. 4, where the reflecting surface at the end of the fiber (not shown) supported by the ferrule 68 resembles the first reflecting element. Since the total mass of the conical supporting member 76 and the first ferrule 68 is comparatively small, they can be moved by the first ring-shaped piezo-actuator 74 at high speed, allowing sweep frequencies way beyond 70 kHz and actually even considerably beyond 200 kHz.

Figure 11:
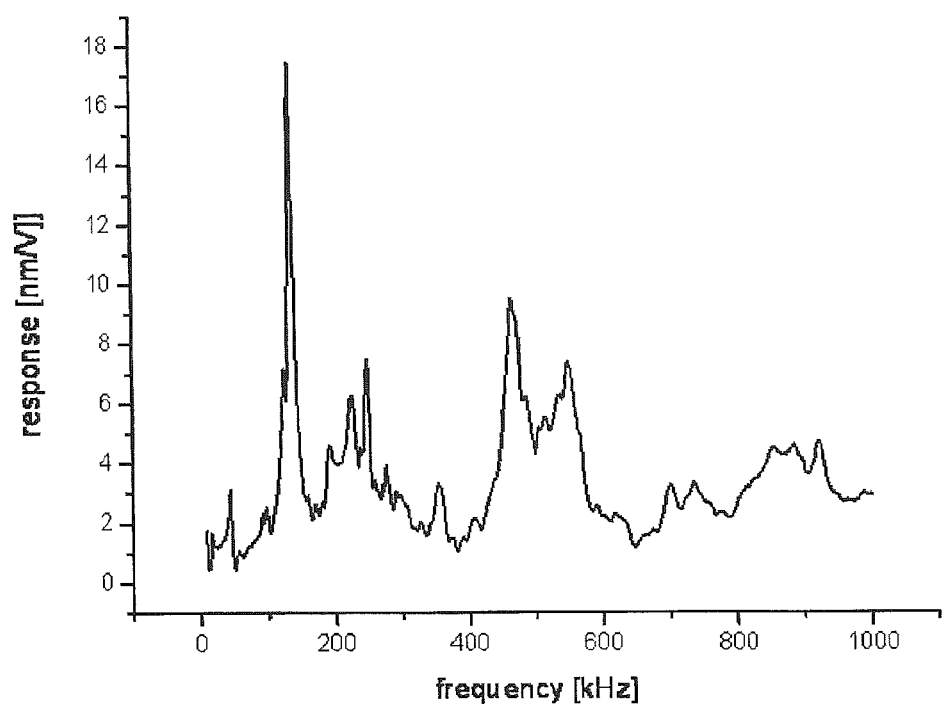
FIG. 11 is a graph showing the response function of the optical path length modulation amplitude for the FP-TF of FIG. 10(a), (b)

FIG. 11 shows the frequency response of the fiber FP-TF device 66 according to the second example, confirming that the response is higher than the DC-response at frequencies considerably above 200 kHz.

An important constructional difference between the fiber FP-TF device 66 of FIGS. 10(a) and (b) as compared to the examples of FIGS. 1 and 2 is again that the first piezo-actuator 74 only drives the first reflecting element, i.e. the reflecting surface at the end of the fiber held by the first ferrule 68, so that the mass that needs to be moved by the first piezo-actuator 74 is comparatively small. In order to reduce weight, the conical supporting member 76 is made from a light weight metal, such as aluminum or magnesium. Also, the conical shape allows for a large area to receive thrust force from the first piezo-actuator 74 while avoiding unnecessary mass.

Further, both the first piezo-actuator 74 and the conical supporting member 76 are ring-shaped, allowing the first optical fiber to be fed therethrough. This allows for a more compact design as compared to the design of FIG. 2, where the optical fiber is not fed through the pie-zo-actuator 24.

Also, when comparing the fiber FP-TF device 66 of FIGS. 10(a) and (b) with that of FIG. 1, it is seen that both, the ring-shaped first piezo-actuator 74 and the supporting member, i.e. the conical supporting member 76 and the first ferrule 68, can be made much smaller and lighter than in case of the design of FIG. 1, where both optical elements are driven by the same piezo-actuator 20.

In some examples, the FP-TF filter may comprise a sensor for wavelength calibration, i.e. a sensor that allows measuring the optical path length in absence of any modulation due to the first actuator means. In one example, the optical path length can be estimated by a capacitance measurement employing a capacitive sensor. For this, at least one metal component is provided at a portion of the first optical element such as to form part of a capacitor employed in the capacitance sensor. The capacitance obtained should be in a range of 0.1 to 100 pF, preferably in a range from 1.0 to 40 pF, and most preferably between 10 and 30 pF. This can be e.g. achieved by depositing a conductive film on part of the first reflecting element, such as a metal coating or an indium tin oxide (ITO) coating. The advantage of an ITO coating is that it is and can hence be provided on the entire surface of the first reflecting element. Preferably, the distance between the capacitor plates is less than 0.1 mm, more preferably less than 0.05 mm and most preferably less than 0.03 mm. The area of the capacitor plate is preferably larger than 0.1 mm$^2$, preferably larger than 1 mm$^2$ and most preferably larger than 5 mm$^2$.

FIG. 12 shows a measurement setup for measuring the capacitance, showing the FP-TF filter 28 or 66 according to one of the previous examples, a measuring circuit board 82 including a microcontroller ATMEGA 88 and a measuring chip AD 7746. The microcontroller reads the capacitance measurements of the measuring chip and communicates them via a serial interface to a PC 84 which in the present example is equipped with the "labview" program. Further shown in FIG. 12 is a programming interface 86 (JTAGICE mk II) by which the program of the microcontroller can be modified. However, during ordinary operation, this program interface is not needed.

FIG. 13 schematically shows an alternative setup for measuring the length of the resonator cavity. Herein, FIG. 13 shows in a simplified way the setup of FIGS. 6(a) and (b) where the same reference signs are used to designate corresponding components. In addition to the components of FIGS. 6(a) and (b), a light source 88 is shown, such as an LED or a laser that emits light into the resonator cavity 56. Further, a photo detector 90, such as a photo diode, is provided which receives part of the light radiated by the light source 88 into the resonator cavity 56. Any decrease in the length of the resonator cavity 56 will lead to a decrease in the intensity of the light signal received at the photo detector 90. Consequently, the intensity of the light signal of the photo detector 90 is a measure for the current length of the resonator cavity 56, which can be used for calibration purposes.

FIG. 14 shows a circuitry for driving the first piezo-actuator 50, 74 of the first and second examples, respectively. In FIG. 14, the first piezo-actuator 50, 74 is resembled by an equivalent capacitance. An inductivity 92 is provided in parallel to the piezo-actuator 50, 74 to thereby form an LC-parallel oscillator circuit 94, the frequency of which can be adjusted to the desired driving frequency, such as to a resonance of the FP-TF device.

Further provided is an LC-series oscillator circuit 96 that is connected in series with the first piezo actuator 50, 74. This LC-series circuit is as well adjusted to the desired driving frequency. If it is intended to drive the first piezo-actuator 50, 74 at different frequencies, for example higher harmonics of a ground resonance, then several of the LC-series circuits 96 can be provided in parallel.

Finally, a bias-T circuit 98 is provided, allowing to bias the AC-driving signal with a DC-input without disturbing the other components.

FIG. 15(a) is a perspective view of a tuneable VCSEL 100 according to an embodiment of the invention. FIG. 15(b) is a sectional close-up view of the resonator cavity of the tuneable VCSEL 100. FIG. 16 is a schematic sectional view of the tuneable VCSEL 100 of FIG. 15, not drawn to scale, to more easily explain the components involved.

With reference to FIG. 15(a), the tuneable VCSEL 100 comprises two holding members 102 interconnected by two piezo-electric actuators 104, which together form first actuation means. Each of the holding members 102 comprises a bore for receiving a ferrule 106 of which, however only, one accommodates an optical waveguide 108. Between the ends of the two ferrules 106 an air gap 109 is formed, which forms part of an optical resonator cavity 110, as is best seen in FIG. 15(b) and FIG. 16.

With reference to FIG. 16, it is seen that the upper one of the ferrules 106 encloses the optical waveguide 108, where the optical waveguide 108 comprises a fiber core 112 and a cladding layer 114. The end faces of the ferrule 106 and the optical fiber 108 are covered with a polymer layer 116 in which a concave recess 118 is formed, wherein the concave recess 118 is aligned with the fiber core 112 of the optical fiber 108. The polymer layer 116 including the concave recess 118 is covered with a reflective dielectric coating or layer 120 such that the polymer layer 116 and the reflective coating 120 in combination form a "reflective element" as referred to in the present disclosure. The reflective dielectric coating 120 is reflective for the light resonating and amplified in the resonator cavity 110, but is transmissive for light used for optical pumping of the gain medium to be described later. This means that the pump light can be fed into the resonator cavity 110 through the same fiber core 112 through which the light generated in the resonator cavity 110 escapes.

A substrate 122 is provided on the end face of the other ferrule 106, i.e. the lower ferrule in the schematic drawing of FIG. 16. On top of the substrate 122, a reflective coating or layer 124 is provided, such that the substrate 122 and the reflective layer 124 in combination form another "reflecting element". On top of the reflective layer 124, a gain medium 126 is provided, which in turn is covered by an anti-reflective coating (not shown).

As is seen from FIG. 16, the lower ferrule 106, contrary to its usual purpose, does not accommodate any optical fiber, but is only used for carrying the reflecting element, i.e. the substrate 122 and the reflective layer 124 with the gain medium 126 on top. Mounting the substrate 122 at the end face of the ferrule 106 is, however, convenient for two reasons. First of all, ferrules like ferrule 106 are inexpensive, off-the-shelf products which are nevertheless manufactured with highest precision. Accordingly, to the extent that the positioning of the substrate 122 depends on the precision of its direct support structure, the ferrule 106 is particularly suitable, because it is manufactured with high precision.

Moreover, as is seen particularly in FIG. 15(a), when using a ferrule 106 for mounting the substrate 122, identical holding members 102 can be employed, in spite of the fact that the tuneable VCSEL 100 is asymmetric in the sense that only one end thereof is connected with an optical fiber 108.

By operating the first piezo-actuators 104 (see FIG. 15(a)), the distance between the two holding members 102 and hence the length of the resonator cavity 110 can be varied, allowing for tuning the wavelength of the VCSEL. However, it is also noted that the VCSEL design of FIG. 15(a) does not make use of the two features (a) and (b) referred to above for increasing the possible sweep frequencies, i.e. the VCSEL 100 of FIG. 15 is not devised for particularly fast sweep frequencies.

A particular advantage of the VCSEL 100 of FIGS. 15 and 16 is that it can be manufactured and assembled rather easily. In particular, the concave recess 118 can be formed in the polymer layer 116 after it has been deposited on the end of the fiber core 112 and the ferrule 106, such that the concave recess 118 can be formed in precise relation to the fiber core 112. This is much easier than if there were any independent optical components inbetween the fiber core 112 and the resonator cavity 110 that would have to be individually adjusted or aligned. In particular, the concave recess 118 can be easily formed by laser ablation or by a mechanical indentation.

Further, both reflecting elements are formed on the end faces of ferrules 106. The manufacturing precision of the ferrules directly carries over to the manufacturing precision of the tuneable VCSEL 100. In fact, the main remaining task is to provide a very precisely drilled hole in the holding members 102 for receiving the ferrules 106.

So in summary, the whole tuneable VCSEL 100 can be manufactured comparatively easily with very good mechanical precision. This compares favorably to ordinary MEMS-based VCSELs that need to be manufactured in clean room conditions involving a large number of etching and lithography steps, the complexity of which makes small series production at reasonable cost difficult.

Further, it is emphasized that the light in the resonator cavity 110 propagates freely, i.e. it is not confined by any waveguiding material. At the same time, the light is confined in the resonator 10 due to the concave recess 118 which, at the operating wavelength of the tuneable VCSEL 100 provides for a stable resonator 110. Dispensing with any waveguiding material in the resonator cavity 110 makes the construction more simple and also allows for large resonator length modulation, i.e. a large tuning range.

While in the embodiment shown in FIGS. 15 and 16, the gain medium 126 will by optically pumped, this is not limiting, as an electrically pumped gain medium could be used instead. Also, in the embodiments of FIGS. 15 and 16, the gain medium 126 is pumped using light that is coupled into the resonator cavity 110 through the fiber core 112. However, it is likewise possible to pump the gain medium 126 from the back side, i.e. through the substrate 122 and the reflective layer 124, which in this case would have to be transmissive for the pump wavelength.

A further tuneable VCSEL 128 is shown in FIGS. 17(a)-(d). Herein, FIG. 17(a) shows a perspective view, FIG. 17(b) a side view, FIG. 17(c) a sectional view and FIG. 17(d) an enlarged sectional view of part of the resonator cavity.

The left half of the tuneable VCSEL 128 as shown in FIG. 17(b) is very similar to that of FIG. 15(a). It comprises a holding member 130 carrying a ferrule 106 accommodating an optical fiber 108. Also, as in the embodiment of FIG. 15, a polymer layer 116 with a concave recess 118 and a reflective dielectric coating 120 is provided (see FIG. 17(d)).

A further holding member 132 is provided, which in this case, however, is different in shape from the holding member 130. The holding members 130, 132 are connected via two piezo-actuators 134, which, unlike the piezo-actuators 104 of FIG. 15, are not intended for use in tuning the resonator cavity length, but are intended for DC-adjustments, such as drift compensation and the like, instead. Accordingly, the piezo-electric actuators 134 correspond to "second actuator means" according to the terminology used herein.

As is particularly seen in FIGS. 17(a), (b), the holding member 132 comprises a protrusion 136 on which a ring-shaped piezo-actuator 138 is provided. This piezo-actuator 138 is intended for dynamically modulating the length of the resonator cavity 110 and is hence referred to as a "first actuator means" in the terminology of the present disclosure.

A substrate 122 with a reflecting layer 124 and a gain medium layer 126 provided thereon is attached to the first piezo-actuator 138. As is seen in FIG. 17(c), the substrate 122 is not directly attached to the first piezo-electric actuator 138 but via an intermediate substrate ring 140.

By operating the first piezo-actuator 138, the substrate 122 with the reflective layer 124 and the gain medium 126 on top can be caused to oscillate in a similar way as was described with reference to FIGS. 5-9 above. Again, the substrate 122 can be caused to oscillate with a large amplitude at high frequencies of several hundred kHz, allowing for sweep frequencies of the same order.

Finally, FIG. 18 shows how the VCSEL 100, 128 may be operated. As seen in FIG. 18, the VCSEL 100, 128 is connected with an arbitrary waveform generator 142 used for operating the first piezo-actuators 104 in case of the tuneable VCSEL 100 of FIG. 15 or the first piezo-actuator 138 in case of the tuneable VCSEL 128 of FIG. 17. Light for pumping the gain medium 126 is generated by a pump laser diode 144 under control of a laser diode control device 146. The pump light is fed into the laser cavity 110 (not shown in FIG. 8) of the VCSEL 100, 138 via a wavelength division multiplexer 145 and the optical fiber 108 that was already shown in FIGS. 15, 16 and 17. Laser light generated in the resonator cavity 110 is coupled out of the resonator cavity 110 via the same optical fiber 108 and passes through the wavelength division multiplexer 145, where it is branched to be guided towards an optical amplifier 148 rather than to the pump laser diode 144. Further, in FIG. 18, isolators 150 and polarization control means 152 are provided in a way per se known.

Although preferred exemplary embodiments are shown and specified in detail in the drawings and the preceding specification, this should be viewed as purely exemplary and not as limiting the invention. It is noted in this regard that only the preferred exemplary embodiments are shown and specified and all variations or modifications should be protected that presently or in the future lie within the scope of protection of the invention.

LIST OF REFERENCE SIGNS 10 fiber Fabry-Perot tuneable filter (FFP-TF)
12 mirrors
14 optical fibers
16 ferrule
18 holding piece
20 piezo-electric actuator
22 arm
24 piezo-actuator
26 arrows
28 FP-TF device
30 first part of FP-TF device 28
32 second part of FP-TF device 28
34 second holding frame
36 ferrule
38 second optical fiber
40 reflective surface
42 polymer material layer
44 concave recess
46 dielectric reflective surface
47 second piezo-actuator
48 plate
50 first piezo-actuator
52 first holding frame
54 fiber focusing means
56 resonator cavity
58 first optical fiber
59 gradient index lens
60 peak
62 peak
64 peak
66 FP-TF device
68 first ferrule
70 second ferrule
72 second frame member
74 first piezo-actuator
76 conical supporting member
78 first frame member
80 second piezo-actuator
82 measuring circuit board
84 PC
86 programming interface
88 light source
90 photo diode
94 LC-parallel oscillator circuit
96 LC-series oscillator circuit
98 bias-T circuit
100 tuneable VCSEL
102 holding members
104 piezo-electric actuators
106 ferrule
108 optical waveguide
109 air gap
110 optical resonator cavity
112 fiber core
114 cladding layer
116 polymer layer
118 concave recess
120 reflective dielectric coating
122 substrate
124 reflective layer
126 gain medium layer
128 tuneable VCSEL
130 holding member
132 holding member
134 piezo-actuators
136 protrusion
138 ring-shaped piezo-actuator
140 intermediate substrate ring
142 arbitrary wave form generator
144 pump laser diode
145 wavelength division multiplexer
146 laser diode control device
148 optical amplifier
150 isolator
152 polarization control means

The invention claimed is:

1. A tuneable VCSEL comprising:
a first and a second reflecting element separated by an optical path length to form an optical resonator cavity,
a gain medium provided on top of one of the first and second reflecting elements,
a first actuator means mechanically coupled with one or both of said first and second reflecting elements, said first actuator means being configured to modulate the optical path length between said first and second reflecting elements by a modulation amplitude, said first actuator comprising at least one piezo-electric actuator,
an optical fiber waveguide coupled with one of the reflecting elements configured for coupling light out of the resonator cavity,
wherein the surface of at least one of the first and second reflecting elements has a concave recess formed therein,
wherein the waveguide is in direct contact with one of the reflecting elements, or wherein one of said first and second reflecting elements is formed by an end of said waveguide; and
wherein one of the reflecting elements is formed by a plate, said plate having a free portion that is free to carry out plate vibrations and a supporting portion where the plate is supported.

2. The tuneable VCSEL of claim 1, wherein the resonator cavity between the two reflecting elements is free of any light guiding medium.

3. The tuneable VCSEL of claim 1, wherein one of the reflecting elements comprises a polymer layer in which the concave recess is formed and that is coated with a reflecting layer.

4. The tuneable VCSEL of claim 3, wherein said reflecting layer is a dielectric reflecting layer.

5. The tuneable VCSEL of claim 1, wherein said gain medium is provided with an anti-reflective coating.

6. The tuneable VCSEL of claim 1, wherein the free portion is a central portion and the supporting portion is a circumferential portion at least partly surrounding the central portion of the plate, wherein the supporting portion is directly or indirectly supported by the first actuator means.

7. The tuneable VCSEL of claim 6, wherein the first actuator means is ring-shaped or is comprised of a plurality of actuators arranged along the circumferential portion of said plate.

8. A tuneable VCSEL comprising:
a first and a second reflecting element separated by an optical path length to form an optical resonator cavity, a gain medium provided on top of one of the first and second reflecting elements, a first actuator means mechanically coupled with one or both of said first and second reflecting elements, said first actuator means being configured to modulate the optical path length between said first and second reflecting elements by a modulation amplitude, said first actuator comprising at least one piezo-electric actuator, an optical fiber waveguide coupled with one of the reflecting elements configured for coupling light out of the resonator cavity, wherein the surface of at least one of the first and second reflecting elements has a concave recess formed therein, wherein the waveguide is in direct contact with one of the reflecting elements, or wherein one of said first and second reflecting elements is formed by an end of said waveguide; and wherein the VCSEL comprises a second actuator means, in particular a second piezo-electric actuator, said second actuator being devised for low frequency actuation such as to compensate drifts in the cavity length, while the first actuator means allows for frequency sweeps in operation.

9. The tuneable VCSEL of claim 8, wherein the free spectral range of the VCSEL is larger than 1 nm.

10. The tuneable VCSEL of claim 9, wherein the free spectral range of the VCSEL is larger than 30 nm.

11. The tuneable VCSEL of claim 10, wherein the free spectral range of the VCSEL is larger than 80 nm.

12. The tuneable VCSEL of claim 8, wherein the center wavelength of the tuneable VCSEL is chosen among one of the following ranges: 750-870 nm, 1000-1100 nm, 1250-1350 nm and 1480-1600 nm.

13. The tuneable VCSEL of claim 8, wherein said VCSEL allows for a sweep frequency of a frequency tuning of at least 1 kHz.

14. The tuneable VCSEL of claim 13, wherein said VCSEL allows for a sweep frequency of a frequency tuning of at least 50 kHz.

15. The tuneable VCSEL of claim 8, wherein the tuneable VCSEL is operated in an inert gas atmosphere or in a vacuum.

16. The tuneable VCSEL of claim 8, wherein the gain medium is optically pumped using pump light that is generated by a laser diode.

17. The tuneable VCSEL of claim 8, wherein the concave recess is provided directly in an end of the fiber, said fiber end forming one of said first and second reflecting elements.

* * * * *